United States Patent [19]

Izumi et al.

[11] Patent Number: 5,289,966

[45] Date of Patent: Mar. 1, 1994

[54] METHOD FOR CONNECTING ELECTRONIC COMPONENT WITH SUBSTRATE

[75] Inventors: Yasuo Izumi, Ikoma; Syoji Sato, Neyagawa; Hiroshi Yamauchi, Kadoma; Ryoji Inutsuka, Katano, all of Japan

[73] Assignee: Matsushita Electric Industrial Co., Ltd., Osaka, Japan

[21] Appl. No.: 942,167

[22] Filed: Sep. 8, 1992

[51] Int. Cl.$^5$ .............................................. B23K 31/02
[52] U.S. Cl. ............................... 228/180.21; 228/187; 228/223; 219/121.64
[58] Field of Search ...................... 228/180.2, 223, 6.2, 228/187; 219/121.64, 129

[56] References Cited

U.S. PATENT DOCUMENTS

| | | | |
|---|---|---|---|
| 3,586,816 | 6/1971 | Hagen | 219/121.64 |
| 3,632,955 | 1/1972 | Cruickshank et al. | 228/180.2 |
| 3,811,182 | 5/1974 | Ryan, Sr. et al. | 228/6.2 |
| 4,196,839 | 4/1980 | Davis | 228/223 |
| 4,889,275 | 12/1989 | Mullen, III et al. | 228/248 |
| 5,167,361 | 12/1992 | Liebman et al. | 228/180.2 |

*Primary Examiner*—Kurt C. Rowan
*Assistant Examiner*—Jeffrey T. Knapp
*Attorney, Agent, or Firm*—Wenderoth, Lind & Ponack

[57] ABSTRACT

A method is provided for electrically connecting a first electronic component which is not resistant to a reflowing temperature and a second electronic component which in resistant to the reflowing temperature to a substrate. The method includes the steps of applying cream solder to a first predetermined portion of the substrate so that the first electronic component is connected therewith and to a second predetermined portion of the substrate so that the second electronic component is connected therewith, mounting the second electronic component on the substrate, heating the second electronic component mounted on the substrate by reflowing so as to solder the second electronic component onto the substrate, forming a pre-soldered portion made of cream solder on the first predetermined portion of the substrate, applying flux to one of the first electronic component and the pre-soldered portion, mounting the first electronic component on the first predetermined portion of the substrate, melting the cream solder of the pre-soldered portion by heating the substrate locally, and soldering the first electronic component onto the substrate. Another method for electrically connecting an unwashable electronic component and a washable electronic component to a substrate includes similar steps to those of the method above.

20 Claims, 21 Drawing Sheets

METHOD FOR CONNECTING ELECTRONIC COMPONENT WITH SUBSTRATE

BACKGROUND OF THE INVENTION

The present invention relates to a method for soldering a composite module component having an electronic component (low-heat-resistant electronic component) which cannot be soldered onto a substrate simultaneously with an electronic component (heat-resistant electronic component) by reflowing, or an unwashable electronic component such as a high frequency electronic component containing a crystal oscillator which cannot be soldered onto the substrate simultaneously with a washable electronic component by reflowing.

When in the composite module component, low-heat-resistant electronic components are soldered onto the substrate simultaneously with heat-resistant electronic components by reflowing at a high temperature, solder which has connected the low-heat-resistant electronic components of the composite module component to the substrate is melted. As a result, the electrical characteristic of the composite module component is destroyed. Therefore, the heat-resistant electronic components cannot be soldered onto the substrate simultaneously with the low-heat-resistant electronic components. In electrically connecting the heat-resistant electronic component and the low-heat-resistant electronic component with the substrate, first, the heat-resistant electronic components are soldered all together onto the substrate according to a procedure as shown in FIG. 23. Then, the low-heat-resistant electronic components are manually soldered onto the substrate. According to another method, the heat-resistant electronic components are soldered all together onto the substrate by reflowing and then low temperature solder is applied to the substrate so as to solder the low-heat-resistant electronic components onto the substrate by reflowing at a low temperature as shown in FIG. 24.

In connecting to a substrate washable electronic components and unwashable electronic components having a crystal oscillator which may be destroyed when it is subjected to ultrasonic waves, the washable electronic components are soldered simultaneously onto the substrate by reflowing and washed. Then, the unwashable electronic components are manually soldered onto the substrate as shown in FIG. 25.

The above-described manual soldering of the low-heat-resistant electronic components and the unwashable electronic components are performed to decrease the action of flux and relieve the heat shock of a printed circuit board. That is, as shown in FIG. 26, electrodes 100a and 100b of a substrate 34, a heat-resistant composite module component 99, and an electronic unwashable component 103 having a crystal oscillator 101 are preheated. Then, solder 97 is supplied and melted by a soldering iron 98. Then, the solder 97 is cause to flow onto connecting portions. Thereafter, the heat-resistant electronic component 99 and the unwashable electronic component 103 are supplied to a substrate 34 and the solder 97 is then melted by the soldering iron 98. Thus, the electrodes of the electronic component 99 are soldered onto the electrodes 100a and 100b of the substrate 34.

However, it depends on an operator's workmanship as to whether or not electronic components are soldered favorably onto the substrate. Thus, the conventional soldering method is not suitable for mass production.

When the electronic components are electrically connected with the substrate in manual operation, fine solder balls scatter in melting the solder 97. When the solder balls 102 stay on an electronic circuit, the function thereof is damaged. In the case of the washable electronic components, the solder balls can be removed from the substrate by washing the substrate and the electronic components simultaneously after they have been soldered onto the substrate, but in the case of the unwashable electronic components having the crystal oscillator, the solder balls cannot be removed from the substrate because the components are unwashable.

In connecting the low-heat-resistant electronic component with the substrate by reflowing at a low temperature, the melting point of the low-temperature solder is approximately 150° C. while the melting point of eutectic solder is 183° C. Therefore, it is difficult to maintain the same temperature and, as such, soldering cannot be accomplished with the same quality.

SUMMARY OF THE INVENTION

It is an object of the present invention to provide a method for connecting to a substrate even an electronic component such as a low-heat-resistant electronic component and an unwashable electronic component at a high speed and with high quality.

In accomplishing these and other objects, according to one aspect of the present invention, there is provided a method for electrically connecting a first electronic component which is not resistant to a reflowing temperature and a second electronic component resisting the reflowing temperature to a substrate, comprising the steps of:

applying cream solder to a first predetermined portion of the substrate so that the first electronic component can be connected therewith and to a second predetermined portion of the substrate so that the second electronic component can be connected therewith;

mounting the second electronic component on the substrate;

heating the second electronic component mounted on the substrate by reflowing so as to solder the second electronic component onto the substrate;

forming a pre-soldered portion made of cream solder on the first predetermined portion of the substrate;

applying flux to one of the first electronic component and the pre-soldered portion;

mounting the first electronic component on the first predetermined portion of the substrate;

melting the cream solder of the pre-soldered portion by heating the substrate locally; and soldering the first electronic component onto the substrate.

According to another aspect of the present invention, there is provided a method for electrically connecting an unwashable electronic component and a washable electronic component to a substrate, comprising the steps of:

applying cream solder to a first predetermined portion of the substrate so that the unwashable electronic component can be connected therewith and to a second predetermined portion of the substrate so that the washable electronic component can be connected therewith;

mounting the washable electronic component on the substrate;

heating the washable electronic component mounted on the substrate by reflowing so as to solder the washable electronic component onto the substrate;

forming a pre-soldered portion made of cream solder on the first predetermined portion of the substrate;

washing the substrate;

applying flux to one of an electrode of the unwashable electronic component and the pre-soldered portion;

mounting the unwashable electronic component on the first predetermined portion of the substrate;

melting the cream solder of the pre-soldered portion by heating the substrate; and soldering the unwashable electronic component onto the substrate.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
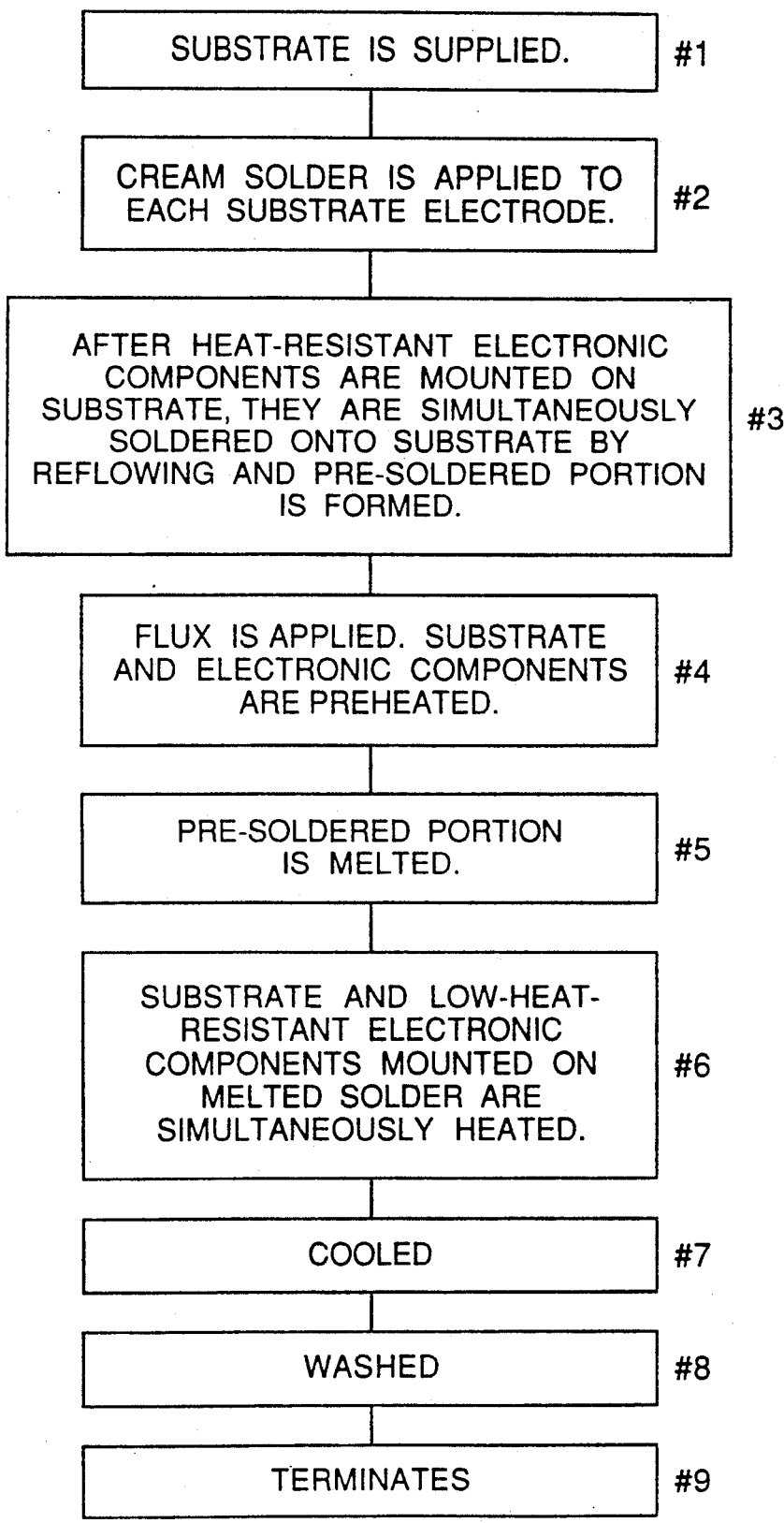
FIG. 1 is a flow diagram schematically showing an example of a process according to a first aspect of the present invention.

Before the description of the present invention proceeds, it is to be noted that like parts are designated by like reference numerals throughout the accompanying drawings.

Figure 2:
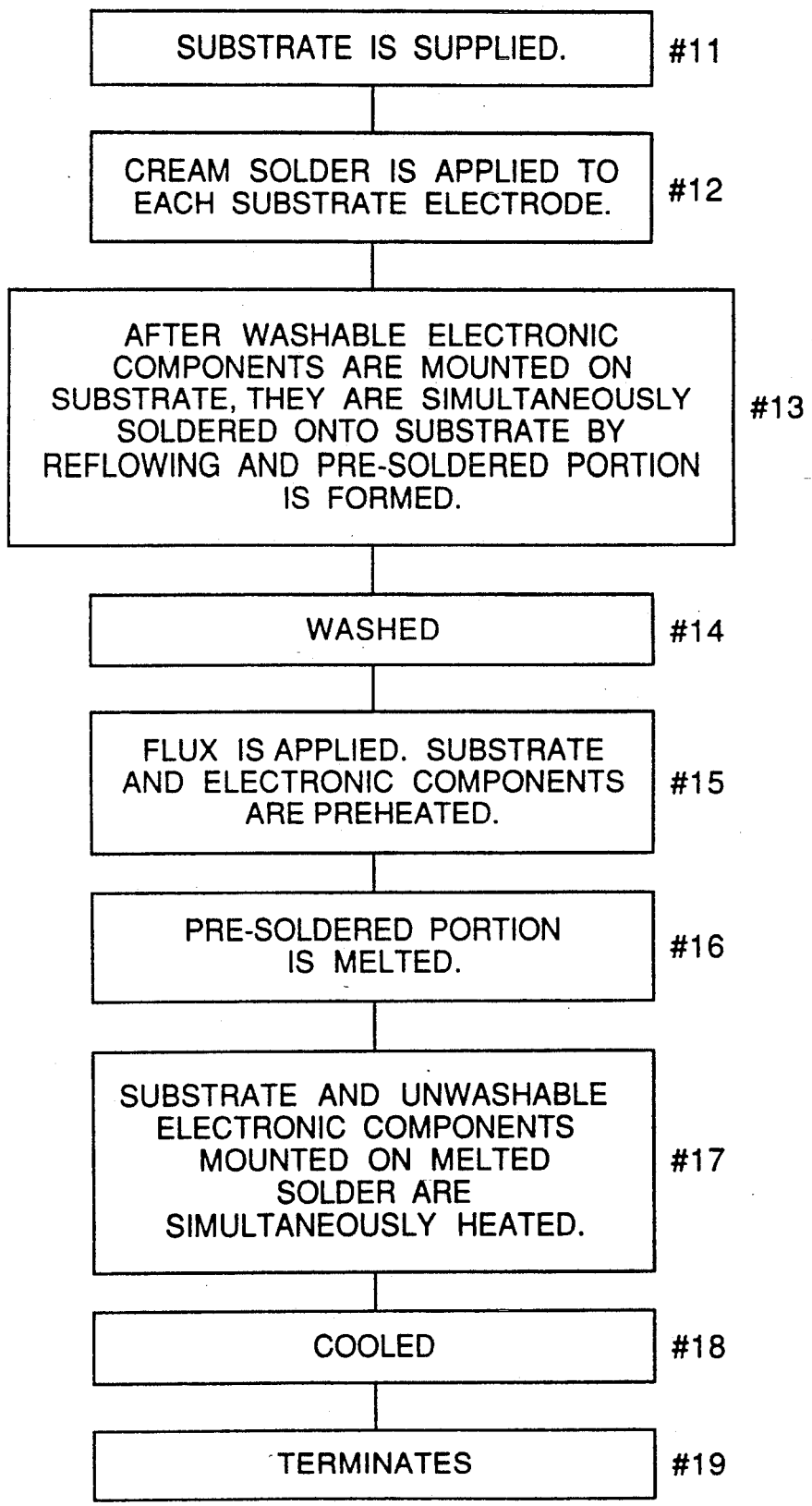
FIG. 2 is a flow diagram schematically showing an example of a process according to a second aspect of the present invention.

Referring to FIGS. 1 through 10, a first embodiment of the present invention is described below. FIG. 1 is a flow diagram showing the outline of the process of connecting a first electronic component which is resistant to a reflowing temperature and which is called "heat-resistant electronic component" in this specification, and a second electronic component which is not resistant to reflowing temperature and which is called "low-heat-resistant electronic component" in this specification, such as a composite module electronic component with a substrate. FIG. 2 is a flow diagram showing the outline of the process of connecting a washable electronic component and an unwashable electronic component with the substrate.

In the process shown in FIG. 1, after a substrate is supplied at step #1, eutectic cream solder is applied to each substrate electrode to be connected with each electronic component at step #2. The heat-resistant electronic components are soldered simultaneously to the substrate by reflowing. Then, the eutectic cream is solidified to form a pre-soldering portion at step #3. At step #4, flux is applied, and the substrate and the heat-resistant electronic components are preheated. Then, at step #5, the solder of the pre-soldering portion is melted. At step #6, the low-heat-resistant electronic components such as a composite module component comprising a plurality of electronic components are mounted on the melted solder of the pre-soldering portion. Thereafter, the electrode of the substrate and the electronic components are simultaneously heated to form solder fillet on each connecting portion at step #6. Then, the substrate and the electronic components are cooled at step #7, washed at step #8, and then this process is completed at step #9.

In the process shown in FIG. 2, after a substrate is supplied at step #11, eutectic cream solder is applied to each substrate electrode to be connected with each electronic component at step #12. The washable electronic components are soldered simultaneously to the substrate by reflowing. Then, the eutectic cream is solidified to form a pre-soldering portion at step #13. At step #14, the substrate is washed. At step #15, flux is applied, and the substrate and the washable electronic components are preheated. Then, at step #16, the solder of the pre-soldering portion is melted. At step #17, the unwashable electronic components such as a composite module component comprising a plurality of electronic components are mounted on the melted solder of the pre-soldering portion. Thereafter, the electrode of the substrate and the electronic components are simultaneously heated to form solder fillet on each connecting portion at step #17. Then, the substrate and the electronic components are cooled at step #18, and then this process is completed at step #19.

Figure 3:
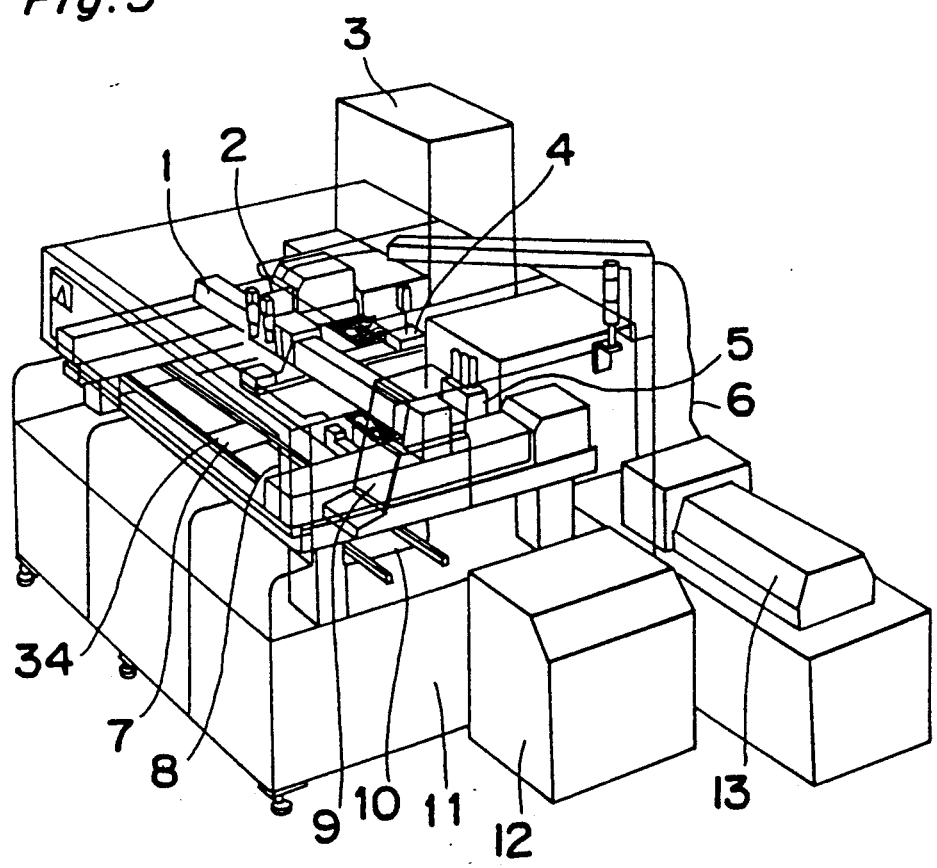
FIG. 3 is a perspective view showing an electronic component-connecting apparatus for carrying out a method according to a first embodiment of the present invention.

FIG. 3 shows an apparatus for connecting an electronic component with a substrate 34 by automatically soldering the low-heat-resistant electronic component onto the substrate 34. The construction of this apparatus is described below.

An X-Y robot 1 is installed on a main body frame 11. A connecting head 2 is fixed to the X-Y robot 1.

An electronic component-moving device 4 moves an electronic component accommodated in a component accommodating section 3 in the movable range of the X-Y robot 1. A substrate transporting section 10 transports the substrate 34 to a substrate-preheating section 8 and a component-connecting position 7. The operation of the apparatus is controlled by an operation panel 9 disposed in a forward portion thereof. In this embodiment, a YAG laser is used as a heat source for connecting the electronic component to the substrate 34. The YAG laser beams generated by a laser power source 12 and a laser optical system 13 are transmitted to the connecting head 2 through an optical fiber 6. Reference numeral 5 denotes a flux-applying section.

Figure 4:
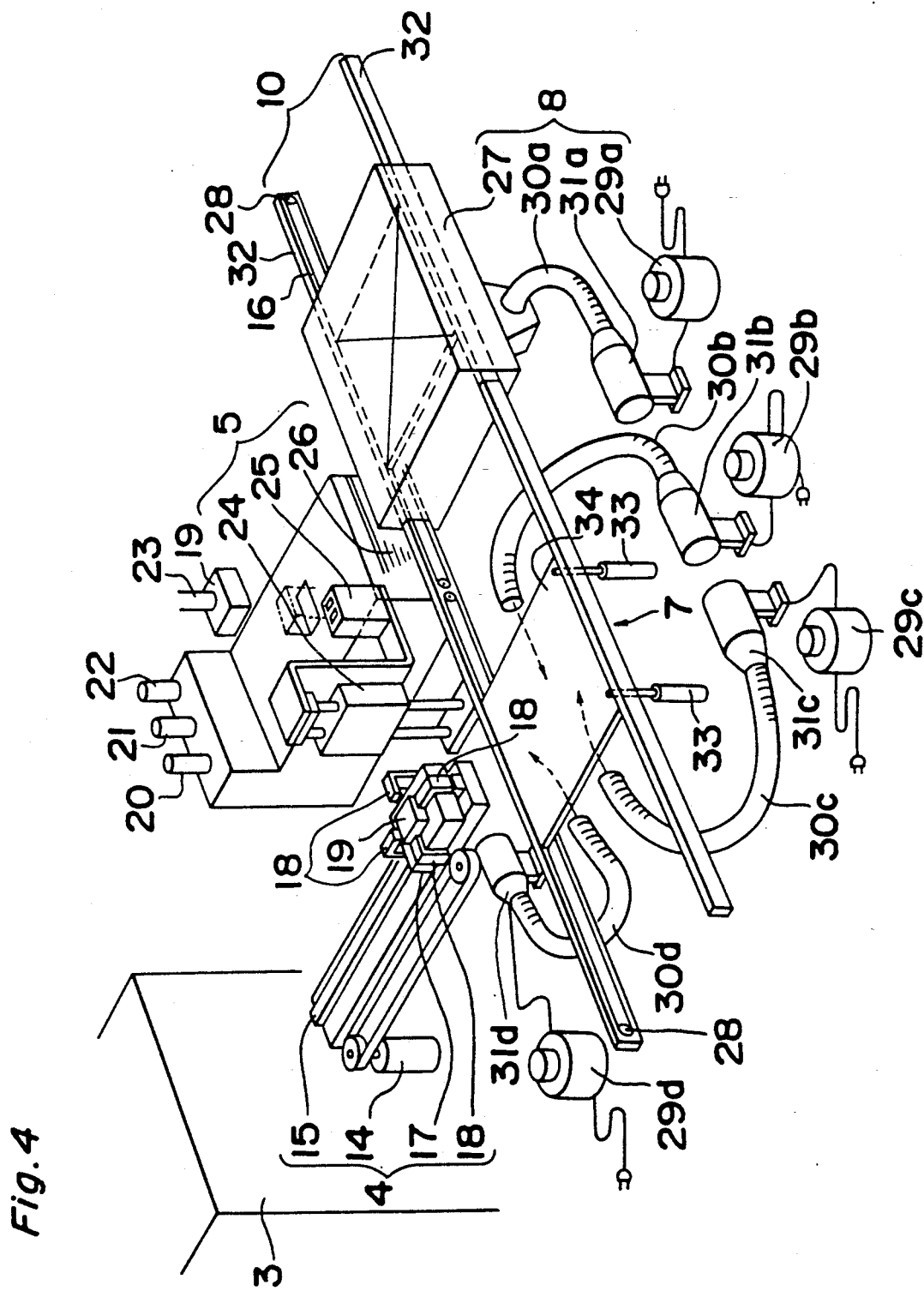
FIG. 4 is a perspective view showing a detailed construction of portions of the electronic component-connecting apparatus of FIG. 3.

Referring to FIG. 4, the construction of the component-moving device 4, the substrate-transporting section 10, the substrate-preheating section 8, and the flux-applying section 5 is described below.

The component-moving device 4 comprises a component-regulating portion 17 having component-regulating claws 18 for regulating the position of the electronic component 19 with a high accuracy. A motor 14 moves the component-regulating portion 17 along a rail 15 so as to move the electronic component 19.

The substrate-transporting section 10 comprising a pair of transporting rails 32 each having pulleys 28 and a transporting belt 16 moves the substrate 34 by the operation of the transporting belt 16.

The substrate-preheating section 8 comprises a substrate-preheating box 27; an air drier 31a; a duct hose 30a for supplying hot air generated by the air drier 31a to the substrate-preheating box 27; and a voltage adjuster (slyduck) 29a for adjusting the source voltage to a preferable condition so as to control the heat quantity of the hot air generated by the air drier 31a. The voltage adjuster 29a and the air drier 31a are connected in series.

The component-connecting position 7 comprises substrate-regulating cylinders 33 for regulating the position of the substrate 34 with a high accuracy. In order to prevent the temperature drop of the substrate 34, hot air generated by the air driers 31b, 31c, and 31d is guided by duct hoses 30b, 30c, and 30d, respectively. In order to control the heat quantity of the hot air generated by the air driers 31b, 31c, and 31d, voltage adjusters 29b, 29c, and 29d are provided similarly to the voltage adjuster 29a of the substrate-preheating section 8.

The flux-applying section 5 comprises an aerometer 20; a dirt-detecting sensor 21; and a liquid level-detecting sensor 22. After flux 26 is introduced into the recess of a flux block 25, the flux 26 in the recess is moved outside by a cylinder 24 and applied to the electrode of the electronic component 19 from below while the electronic component 19 is held by a suction nozzle 23.

The construction of the connecting head 2 is described below with reference to FIG. 5. The connecting head 2 is disposed on an X-axis plate 36 of the X-Y robot 1 through an LM guide 54 and a head frame 55. A ball thread 35 coupled with an X-axis motor (not shown) slidably moves the connecting head 2 on the LM guide 54 along the X-axis. A spline shaft 37 engages the head frame 55 through a bearing 38 and a spline nut 40 and is rotatable in $\theta$ direction by a nozzle rotation motor 52 through a pulley 50a and a timing belt 51a connected with the spline nut 40. The rotation of a motor 53 for moving the nozzle 23 vertically is transmitted to a ball thread 57 through a pulley 50b and a timing belt 51b so as to convert the rotary motion of the motor 53 into a vertical motion of a nozzle vertical block 56. The vertical motion is transmitted to a disk 41 engaged with the spline shaft 37. The vertical nozzle block 56 engages the disk 41 through cam followers 42. Thus, the nozzle 23 is vertically movable.

The movable portion of the nozzle 23 of the spline shaft 37 is splined and held by the spline nut 40. Therefore, the spline shaft 37 is smoothly movable in the vertical direction.

The spline shaft 37 is hollow. The vacuum generated in a vacuum unit 49 is transmitted to the nozzle 23 through a pipe 48, a hose 47, and a rotatable pipe 46 so that the electronic component 19 can be sucked by the nozzle 23. A shaft guide 59, connected with a block 58 engaged by the head frame 55, is a slidable guide for preventing the spline shaft 37 from shaking in the rotational direction thereof.

A spring 106 disposed between the spline shaft 37 and the nozzle 23 serves as a means for absorbing a shock generated when the spline shaft 37 moves downward to mount the electronic component 19 on the substrate 34. An air pipe 44 jets air to be used to cool solder melted by laser beams. Laser beams are emitted from beam-emitting portions 39. Reference numeral 61 denotes a cylindrical lens, and 43 denotes a beam-intercepting plate.

The operation of the apparatus is described below with reference to FIGS. 3 through 5. The electronic component 19 accommodated in the component accommodating section 3 is moved to the component-regulating portion 17 of the component-moving device 4 by a moving means (not shown). In the component-regulating portion 17, the component-regulating claws 18 regulate the position of the electronic component 19 and, simultaneously, the motor 14 drives the component-regulating portion 17 to move along the rail 15. The electronic components 19 accommodated in the component-accommodating section 3 are sequentially moved to the movable range of the X-Y robot 1 while the position of the electronic component 19 is regulated. Then, the connecting head 2 engaged by the X-Y robot 1 is positioned at a predetermined position above the electronic component 19. The drive force of the motor 53 is transmitted to the ball thread 57 so as to move the nozzle 23 downward and, simultaneously, the vacuum unit 49 disposed on the connecting head 2 is operated so that the electronic component 19 is sucked by the nozzle 23.

Then, the nozzle 23 which has sucked the electronic component 19 is moved upward and the X-Y robot 1 is moved so that the electronic component 19 is located at the predetermined position above the flux block 25 of the flux-applying section 5. In the flux-applying section 5, the flux block 25 sunk in the flux 26 which has been controlled in its specific gravity, dirt degree, and liquid level by the aerometer 20, the dirt-detecting sensor 21, and the liquid level-detecting sensor 22, respectively is moved upward by the cylinder 24. Then, the flux 26 is pumped up into the recess of the flux block 25 so that the flux 26 is applied to the electrodes of the electronic component 19 positioned at the predetermined position above the flux block 25. Thereafter, the flux block 25 is moved downward by the cylinder 24 so as to sink the flux block 25 into the flux 26. In this manner, the flux applying operation is completed. The electronic component 19 is moved by the X-Y robot 1 to a predetermined position above the component-connecting position 7 of the substrate 34 which has been position-regulated by the cylinder 33 in the component-connecting position 7 disposed on the substrate-transporting section 10.

At this time, the substrate 34 is transported to the component-connecting position 7 after it is preheated to a preferable temperature by the substrate-preheating section 8 disposed upstream of the substrate 34 and remains preheated by hot air blown out from the air driers 31b, 31c, and 31d.

The apparatus connects a composite module component having a plurality of electronic components to the substrate. The substrate 34 supplied to this apparatus has undergone the process of steps #1 to #4 of FIG. 1. If the temperature of the air inside the substrate-preheating section 8 disposed on the substrate transporting section 10 becomes too high, the eutectic solder which fixes the heat-resistant electronic components which have been soldered to the substrate 34 is melted. Then, there is a possibility that a defective product is manufactured. Therefore, the voltage adjuster 29a adjusts the heat quantity of hot air generated by the air drier 31a to a preferable heat quantity. For the same reason, the voltage adjusters 29b, 29c, and 29d are provided in the vicinity of the air driers 31b, 31c, and 31d, respectively, which supply hot air to the component-connecting position 7. Thus, the preheating effect can be maintained.

The electronic component 19 sucked by the nozzle 23 is preheated by hot air blown out from an air drier (not shown) until it is mounted on the substrate 34.

The optical system will be described below.

Figure 5:
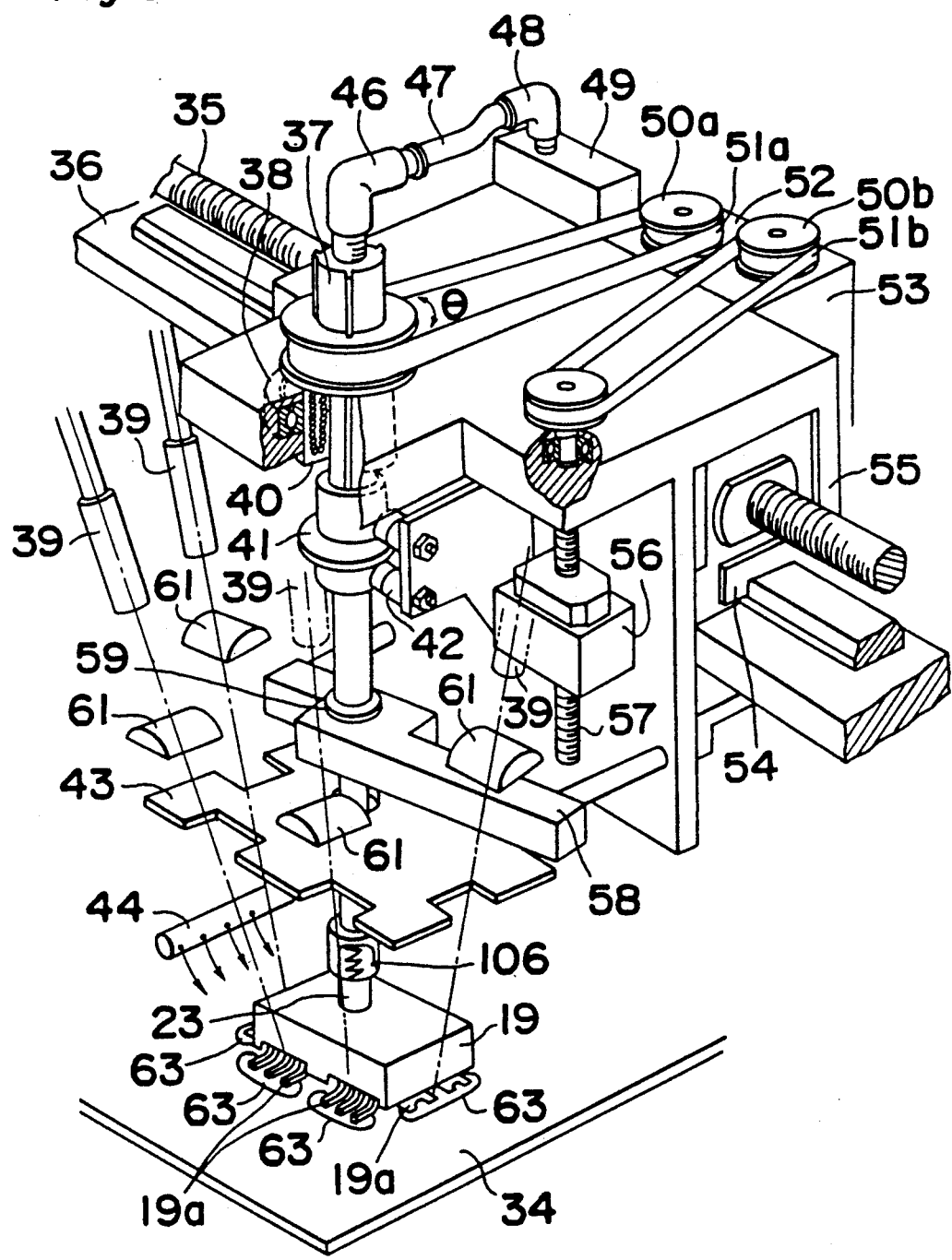
FIG. 5 is a perspective view showing a detailed construction of a connecting head of the electronic component-connecting apparatus of FIG. 3.

In FIG. 5, laser beams transmitted by the optical fibers 6 are condensed by the beam-emitting portions 39 and polarized in elliptic configurations by the cylindrical lenses 61 supported on the optical paths by members (not shown). The electronic component 19 is soldered onto the substrate 34 by irradiating the electrodes 19a of the electronic component 19 and the electrodes 63 of the substrate 34 with the polarized laser beams.

The principle and action of the beam-intercepting plate 43 for intercepting a part of the polarized laser beams are described below with reference to FIGS. 6(a) through 6(d).

The laser beams are emitted from the end surface of the optical fiber 6 shown in FIG. 6(a) at an angle of approximately 60°. The beam-emitting portion 39 having a plurality of condenser lenses 60 is installed on the optical fiber 6 as shown in FIG. 6(b). Thus, the laser beams can be condensed to two to three times as large as the core diameter of the optical fiber 6. As shown in FIG. 6(c), the laser beams are polarized in an elliptic configuration by the cylindrical lens 61 provided in the optical paths of the laser beams. As shown in the lower portion of FIG. 6(c), the measurement of the temperature distribution of the laser beams made along the major axis of the ellipse indicates that the temperature is highest in the center portion of the ellipse and becomes gradually lower toward the periphery thereof. As shown in FIG. 6(d), the beam-intercepting plate 43 is provided in the optical paths of the laser beams so as to intercept portions of the laser beams in the vicinity of the end portions of the ellipse which are low in temperature. Consequently, the laser beams can be taken at only the center region of the ellipse can be utilized, namely, the temperature-stabilized regions of the laser beams can be utilized. That is, the beam-intercepting plate 43 is used so that of the laser beams polarized in the elliptic configuration by the cylindrical lens 61, only the laser beams in the temperature-stabilized region of the ellipse are used to irradiate the necessary portion of the substrate 34.

The connection timing of the electronic component will be described below.

Figure 7:
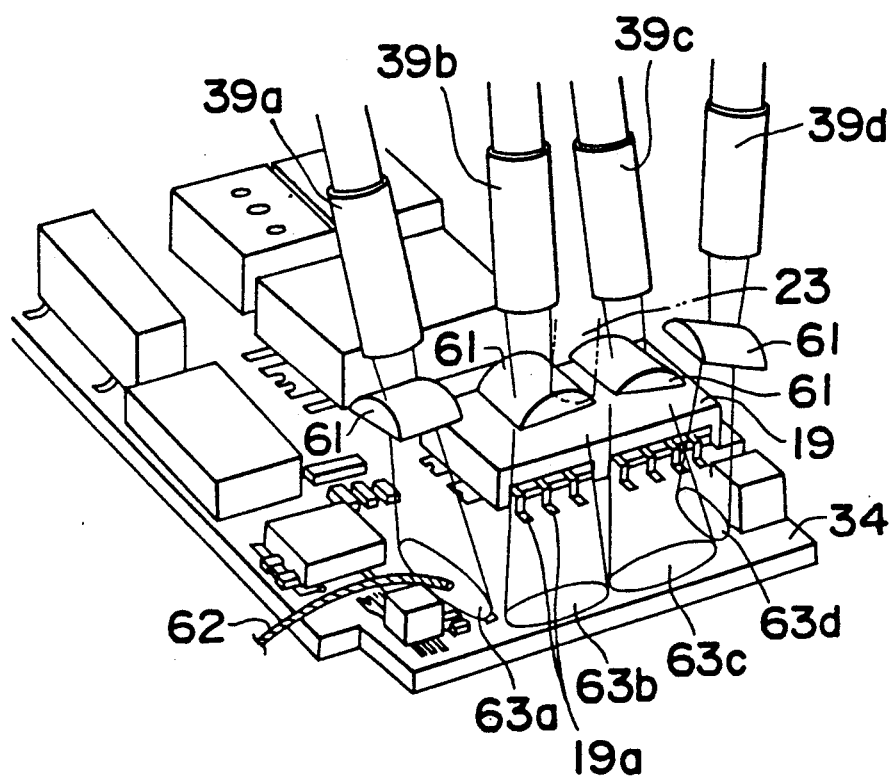
FIG. 7 is a perspective view showing the process of connecting an electronic component to a substrate by means of laser beams.
Figure 9:
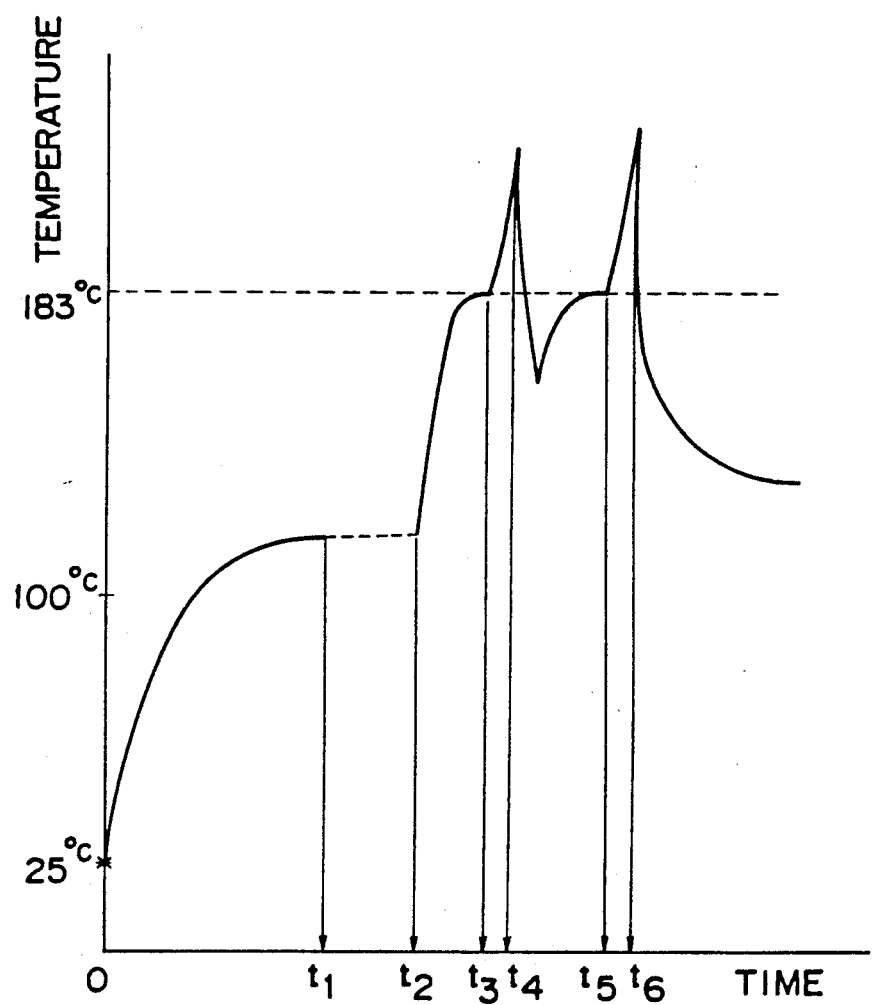
FIG. 9 is a graph showing the temperature state of a pre-soldered portion of a substrate electrode in the process of connecting the electronic component to the substrate.

Referring to FIG. 7, the beam-emitting portions 39a, 39b, 39c, and 39d emit laser beams to the electrodes 63a, 63b, 63c, and 63d of the substrate 34 on which the electronic component 19 has been pre-soldered by forming pre-soldered portions thereon. The temperature of the solder is measured by a thermocouple 62 soldered onto the electrode 63a of the substrate 34 at a high temperature so as to examine the melting condition of the solder. The result obtained by the measurement made by using the thermocouple 62 is sent to a pen recorder (not shown). Thus, a temperature curve as shown in FIG. 9 is obtained. The temperature measurement of the solder starts from the time when the electronic component 19 is transported to the apparatus. The temperature of the substrate 34 at this time is 25° C. The substrate 34 is preheated by the substrate-preheating section 8 at 100° C. to 130° C. and transported to the component-connecting position 7 at time $t_1$. The heat quantity of the air drier 31a of the substrate-preheating section 8 is adjusted by the voltage adjuster 29a so that the preheating temperature of the substrate 34 is maintained below 140° C. by the substrate-preheating section 8. Therefore, even though an abnormality occurs in the apparatus and as a result, the substrate 34 stays in the substrate-preheating section 8, the solder-connecting portions of the electronic component 19 with the substrate 34 in the previous process do not melt. When the substrate 34 is first irradiated by laser beams at time $t_2$ with the electronic component 19 disposed at the predetermined position over the substrate 34 as shown in FIG. 7, the solder of the pre-soldered portions melts. As a result, the temperature rise of the solder stops temporarily in the vicinity of the melting point 183° C. of the eutectic solder. But the temperature rises rapidly from time $t_3$ at which the melting of the pre-soldered portions has been completed.

Figure 8:
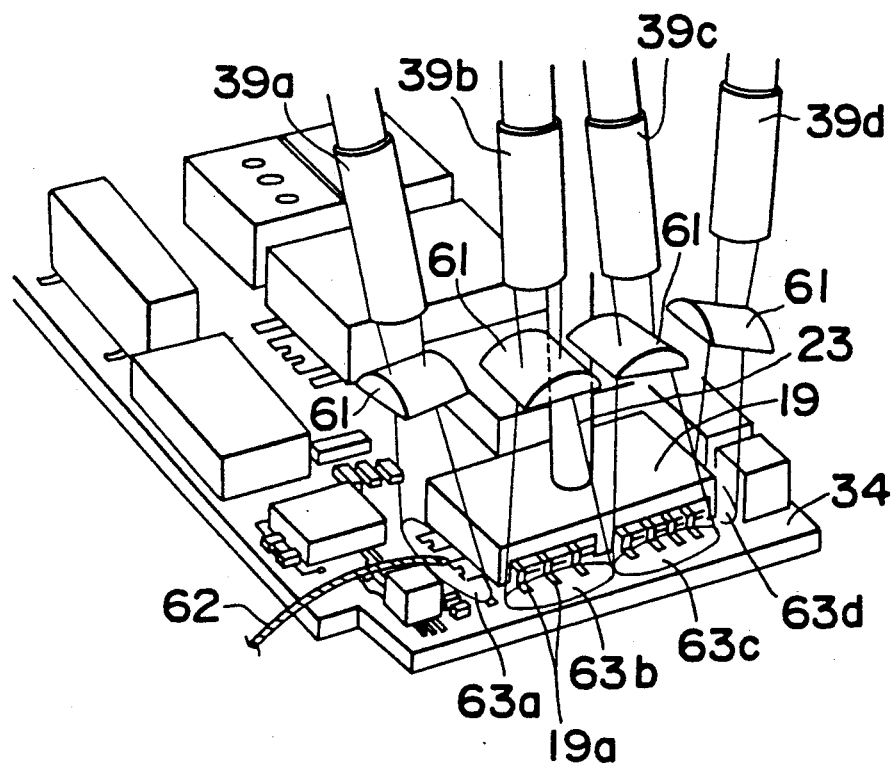
FIG. 8 is a perspective view showing the process of connecting the electronic component to the substrate by means of laser beams.

When the electronic component 19 held by the suction nozzle 23 is installed on the melted solder at time $t_4$ as shown in FIG. 8, the temperature of the solder of the electrodes 63a of the substrate 34 may drop below the melting point thereof. The solder is melted again at time $t_5$ with the continued irradiation of the electronic component 19 and the substrate 34. At time $t_6$, a sufficient amount of solder fillet is formed on the electrodes 19a of the electronic component 19 and the electrodes 63 of the substrate 34. Thereafter, the irradiation of laser beams is stopped and the solder is solidified by an air flow jetted out from the air pipe 44 shown in FIG. 5. As a result, the electronic component 19 is electrically connected with the substrate 34. Then, the nozzle 23 is moved upward. In this manner, a series of processes for connecting the electronic component 19 with the substrate 34 is completed.

Referring to FIG. 9, the period of time between the time $t_2$ at which the solder of the pre-soldered portions is melted and the time $t_4$ at which the electronic component 19 is installed is hereinafter referred to as "preheat period of time". The period of time between the time $t_4$ and the time $t_6$ at which the solder fillet is formed is hereinafter referred to as "reflowing period of time". Supposing that the preheat period of time of the electrodes 63a, 63b, 63c, and 63d of the substrate 34 is denoted by $T_{Pa}$, $T_{Pb}$, $T_{Pc}$ and $T_{Pd}$, respectively; and the reflowing period of time thereof is denoted by $T_{Ra}$, $T_{Rb}$, $T_{Rc}$, and $T_{Rd}$, respectively, the electrodes 63a, 63b, 63c, and 63d of the substrate 34 are irradiated by laser beams, with the time $t_4$ at which the electronic component 19 is mounted on the melted solder set as the return point in order to minimize the thermal shock of laser beams applied to the substrate 34.

Let it be supposed that the electronic component 19 has four electrodes and the preheat period of time in which the pre-soldered portions formed on the electrodes 63a, 63b, 63c, and 63d of the substrate 34 are melted by laser beams emitted by the same number of the beam-emitting portions 39 is denoted by $T_{Pa}$, $T_{Pb}$, $T_{Pc}$, and $T_{Pd}$, respectively, according to the length of time; and the reflowing period of time from the time at which the electronic component 19 is installed on the re-melted solder until the time an appropriate amount of solder fillet is formed on each electrode of the electronic component 19 is denoted by $T_{Ra}$, $T_{Rb}$, $T_{Rc}$ and $T_{Rd}$, respectively. Each pre-soldered portion is irradiated by laser beams emitted from the beam-emitting portions 39a, 39b, 39c, and 39d in the order of the preheat period of time $T_{Pa}$, $T_{Pb}$, $T_{Pc}$, and $T_{Pd}$, respectively, so that the solder of each pre-soldered portion is melted in the preheat period of time $T_{Pa}$. Simultaneously with the melting of the solder of each pre-soldered portion, the electronic component 19 is installed on the melted solder. Then, heating starts to form solder fillets and the beam-emitting portions 39d, 39c, 39b, and 39a sequentially stop irradiating laser beams so that the formation of the solder fillet is completed at each electrode of the substrate 34 in the reflowing period of time $T_{Ra}$. Thereafter, air is jetted out from the air pipe 44 to the connection portion between the electronic component 19 and the substrate 34 so as to solidify the solder. Thus, the connection between the electronic component 19 and the substrate 34 is completed.

When a plurality of the electrodes of the electronic component 19 are soldered onto the pre-soldered portion in the condition in which only a part of the solder is melted, only the electrode disposed on the melted solder penetrates into the solder. As a result, the problem that the other electrode moves upward from the substrate 34 and the electronic component 19 inclines occurs. Thus, the electronic component 19 can not be reliably soldered onto the substrate. This problem must be solved in the case of an electronic component having highly rigid electrodes. But according to the method of the embodiment, the electronic component 19 is installed on the substrate 34 after all solder is melted. Therefore, even an electronic component having rigid electrodes does not become inclined on the substrate 34. Thus, the electronic component 19 can be reliably soldered onto the substrate 34.

Since the pre-soldered portions are formed by the reflowing, the flux component evaporates and the solder is solidified. Therefore, even though the solder of the pre-soldered portion is melted, solder balls are not formed.

Thus, the method of the embodiment is capable of reliably soldering the electronic component 19 onto the substrate 34 without the formation of solder balls, even when the electronic component 19 has a high frequency component such as a crystal oscillator and thus cannot be washed by ultrasonic waves after it is connected with the substrate 34 by solder.

Figure 11:
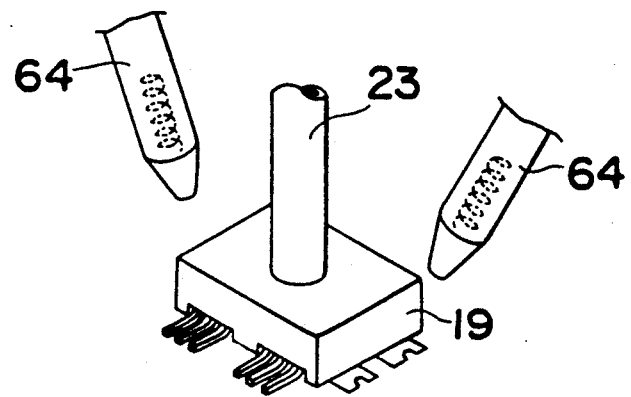
FIG. 11 is a view showing an embodiment in which the electronic component is connected with the substrate by a hot air heater used as a heat source.
Figure 10:
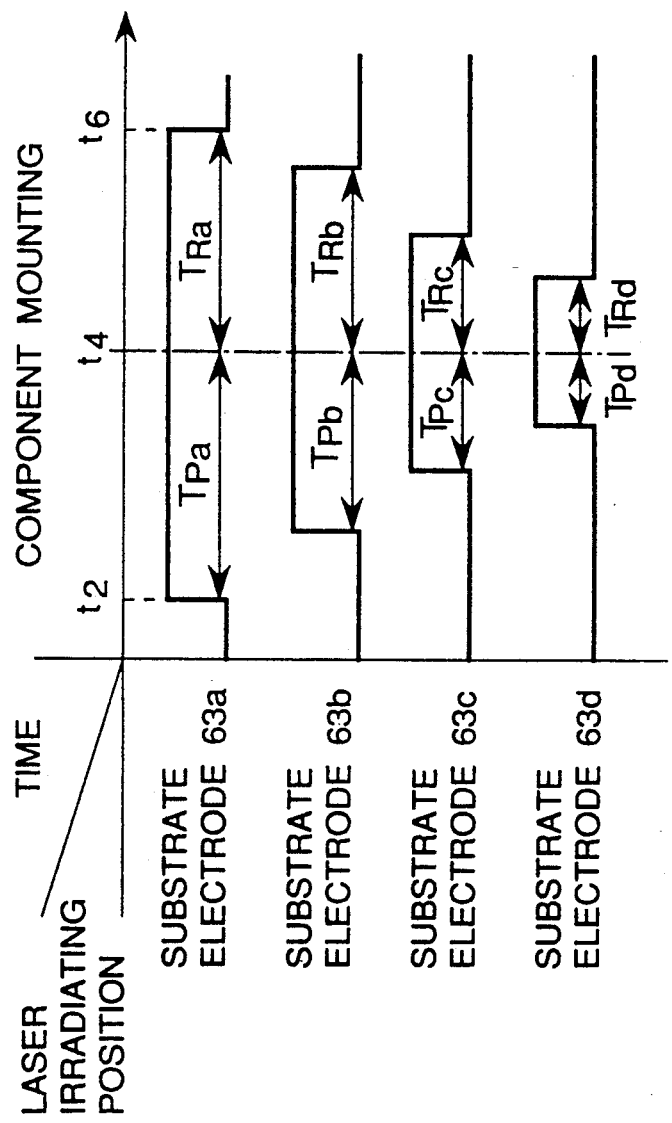
FIG. 10 is a timing diagram showing timing in connecting the electronic component to the substrate.
Figure 12:
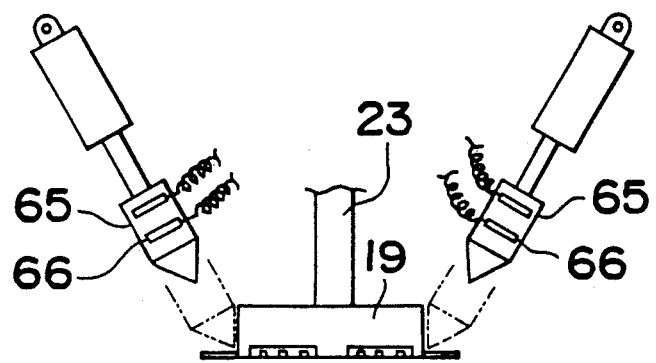
FIG. 12 is a view showing an embodiment in which the electronic component is connected with the substrate by a heating block used as a heat source.
Figure 13:
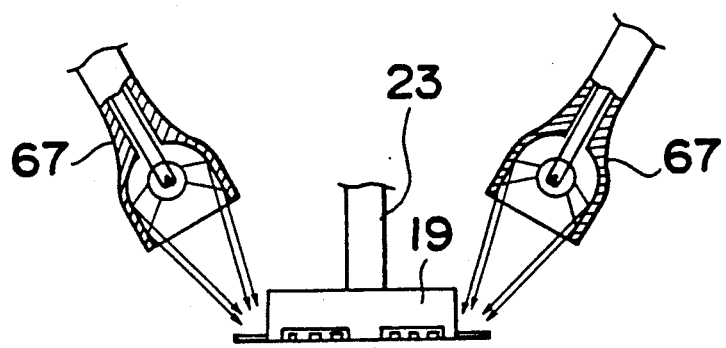
FIG. 13 is a view showing an embodiment in which the electronic component is connected with the substrate by a beam-irradiating means used as a heat source.

In addition to laser beams, other beam-irradiating means such as a xenon lamp, an ultraviolet ray lamp, or an infrared lamp as shown in FIG. 13 may be utilized as a heat source for melting the solder of the pre-soldered portions for connecting the electronic component 19 with the substrate 34. In addition, the solder of the pre-soldered portions may be partially melted by a hot air heater 64 as shown in FIG. 11 or a heating block 65 containing a heater 66 as shown in FIG. 12.

Figure 14:
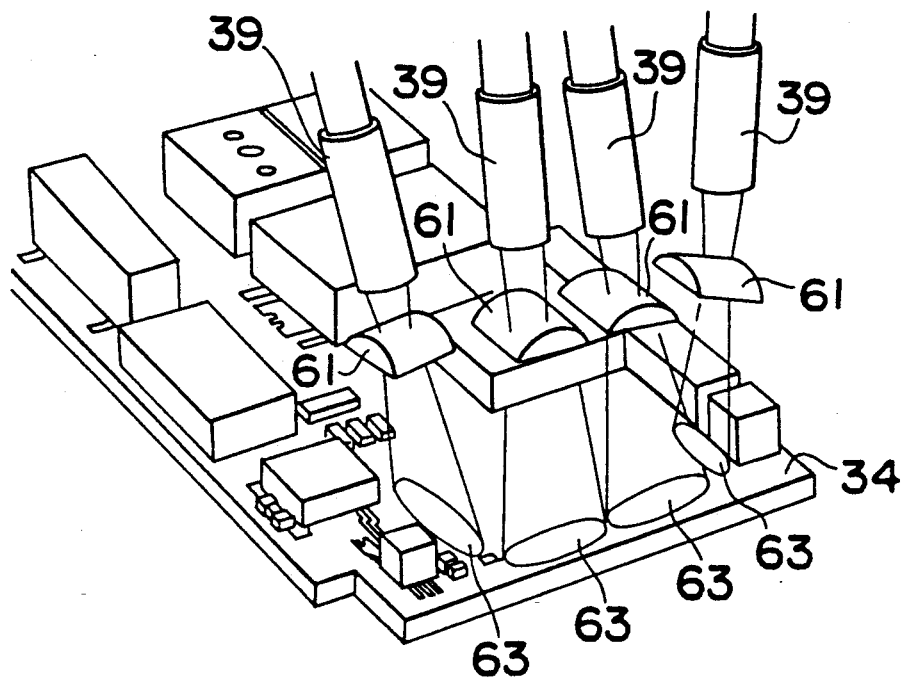
FIG. 14 is a view showing an embodiment in which the substrate is preheated by laser beams used as a heat source.
Figure 15:
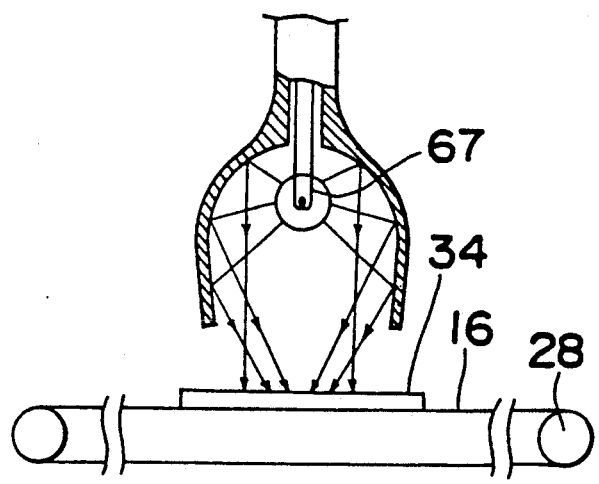
FIG. 15 is a view showing an embodiment in which the substrate is preheated by a beam-irradiating means used as a heat source.
Figure 16:
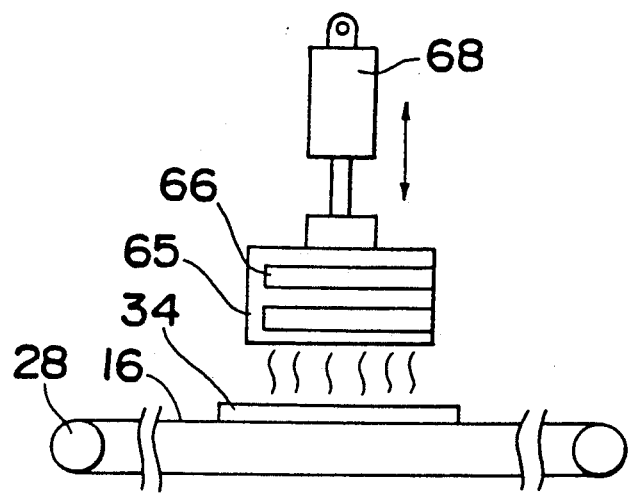
FIG. 16 is a view showing an embodiment in which the substrate is preheated by a heating block used as a heat source.

Although the air drier was described above as the heat source for the substrate-preheating section 8, the substrate 34 may be preheated by laser beams used to melt the solder of the pre-soldered portions as shown in FIG. 14. In addition, beam-irradiating means 67 such as a xenon lamp, an ultraviolet ray lamp, or an infrared lamp as shown in FIG. 15 may be used to preheat the substrate 34. Further, a heating block 65 containing a heater 66 as shown in FIG. 16 may be utilized as a heat source, and a heater-driving means 68 may be utilized to place the heating block 65 in an appropriate position with respect to the substrate 34. Thus, the substrate 34 can be preheated.

According to the first embodiment, laser beams are polarized in an elliptic configuration by the cylindrical lens 61 and the beam-intercepting plate 43 is used to prevent an unnecessary portion of the substrate 34 from being irradiated by the laser beams.

Beam-intercepting means according to a second through a fourth embodiment of the present invention will be described below.

Figure 17:
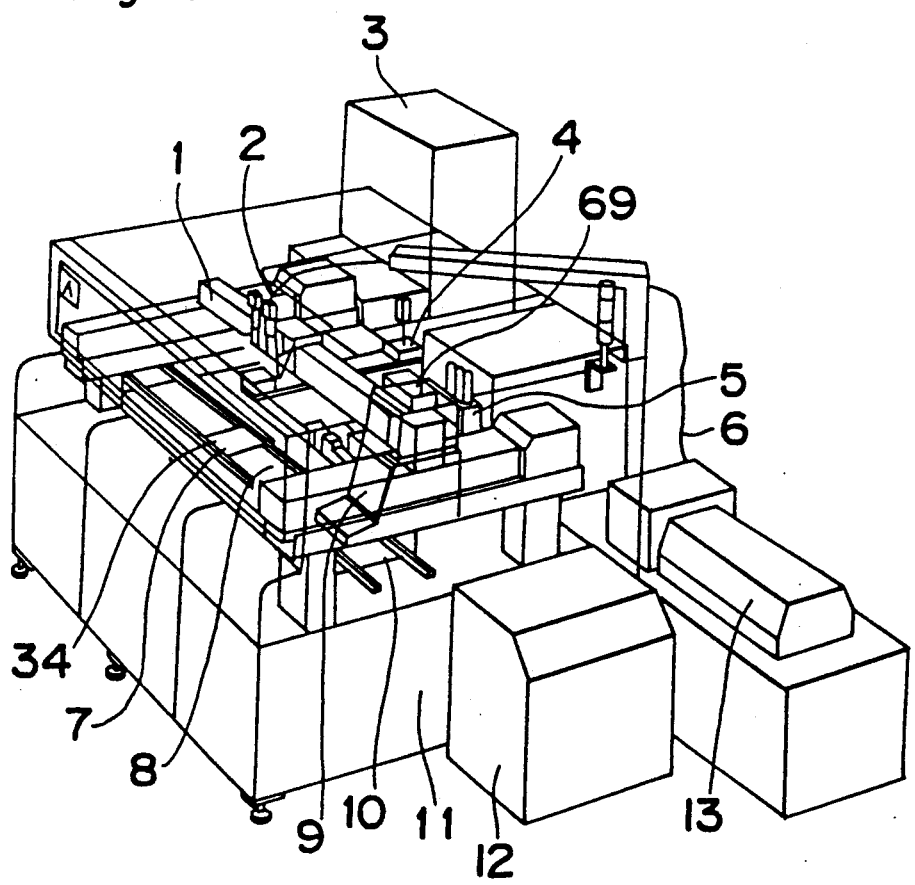
FIG. 17 is a perspective view showing an electronic component-connecting apparatus having a beam-intercepting plate-exchange portion.
Figure 18:
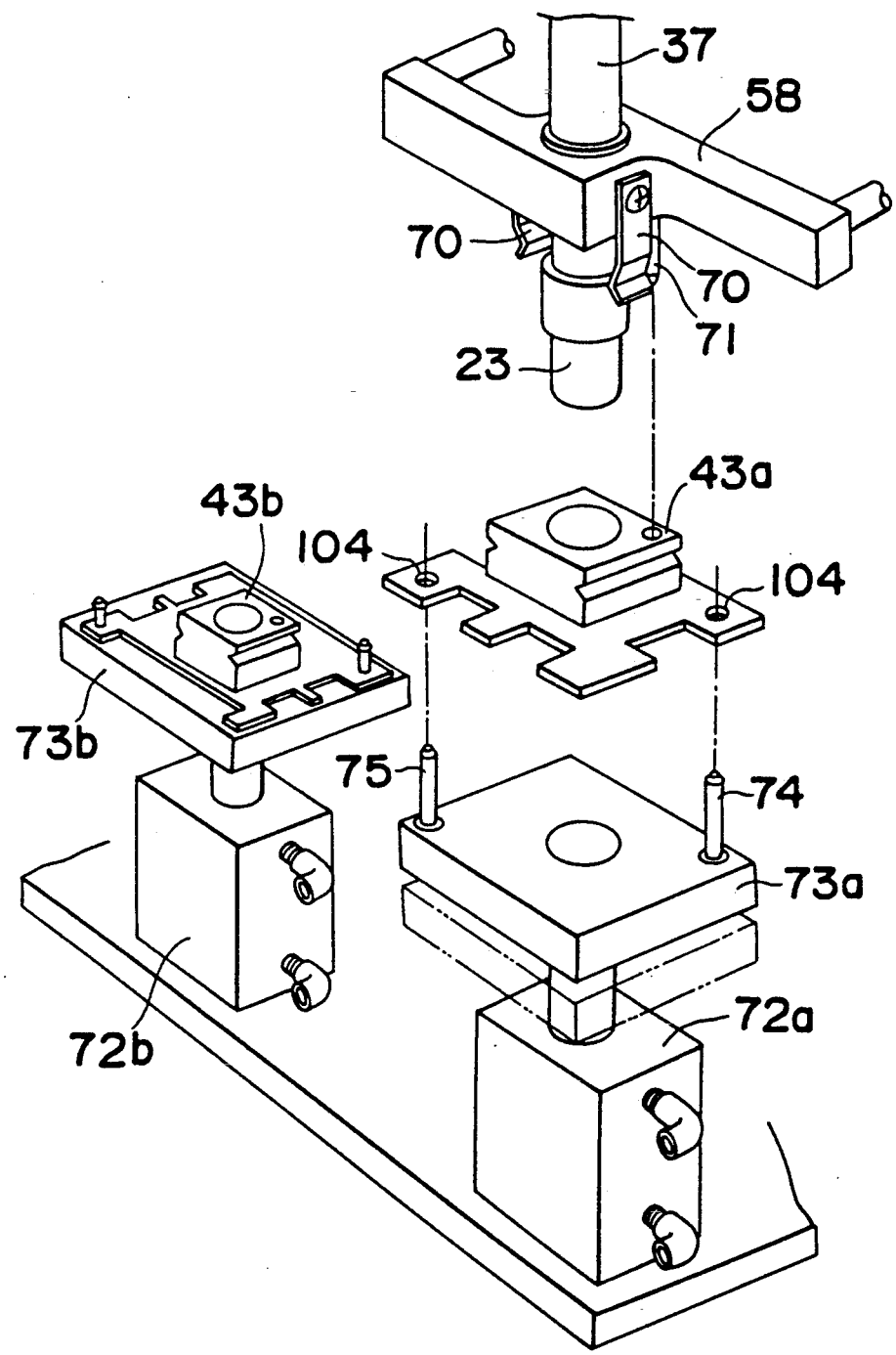
FIG. 18 is a perspective view showing a detailed construction of the beam-intercepting plate-exchange portion.

The beam-intercepting means according to the second embodiment is removable from the electronic component-connecting apparatus. FIG. 18 is a detailed view of a beam-intercepting plate-exchange section 69 shown in FIG. 17. The block 58 of the connecting head 2 has elastic member-locking tools 70, each in the configuration of a flat spring for locking a removable beam-intercepting plate 43a fixed thereto and a pin 71 for positioning the beam-intercepting plate 43a fixed thereto. The beam-intercepting plate 43a has a hollow center through which the nozzle 23 is inserted and locked at a predetermined position by the elastic member-locking tools 70 and the pin 71. A fixed-holding pin 74 and a movable-holding pin 75 are formed on a beam-intercepting plate table 73a which is moved vertically by a beam-intercepting plate-exchange cylinder 72a. The movable-holding pin 75 is moved by a driving source (not shown).

The operation of the beam-intercepting plate-exchange section 69 is described below.

In order to exchange the beam-intercepting plate 43a with a different beam-intercepting plate 43b due to the alteration of an electronic component to be connected with the substrate 34, the nozzle 23 of the connecting head 2 is disposed at a predetermined position above the beam-intercepting plate table 73a and then, the beam-intercepting plate table 73a is moved upward by the beam-intercepting plate-exchange cylinder 72a so as to insert the fixed-holding pin 74 and the movable-holding pin 75 into each positioning opening 104 of the beam-intercepting plate 43a.

As soon as the movable-holding pin 75 is moved to hold the beam-intercepting plate 43a, the beam-intercepting plate table 73a is moved downward by the beam-intercepting plate-exchange cylinder 72a. Thus, the beam-intercepting plate 43a can be separated from the elastic member-locking tools 70 fixed to the block 58 of the connecting head 2.

Then, the nozzle 23 of the connecting head 2 is located at a predetermined position above the beam-intercepting plate table 73b and then, the beam-intercepting plate-table 73b is moved upward by a beam-intercepting plate-exchange cylinder 72b so as to mount the beam-intercepting plate 43b held on the beam-intercepting plate-table 73b on the elastic member-locking tools 70 of the connecting head 2 and the pin 71 thereof. Then, the beam-intercepting plate exchange-cylinder 72b is moved downward. Thus, a series of operations for exchanging the beam-intercepting plate is completed.

According to the second embodiment, a desired kind of beam-intercepting plate is selected from various kinds of beam-intercepting plates to removably mount the beam-intercepting plate on the block 58. Therefore, it is possible to finely adjust the portion of the substrate to be irradiated by laser beams depending on the configuration of the electronic component or that of the electrode of the substrate.

The third embodiment of the present invention is described below. The construction of a liquid shutter used as a means for adjusting the portions of the substrate to be irradiated by the laser beams is described below. The liquid shutter according to the third embodiment is capable of adjusting the placement of laser beams more finely than the beam-intercepting means of the second embodiment.

Figure 6:
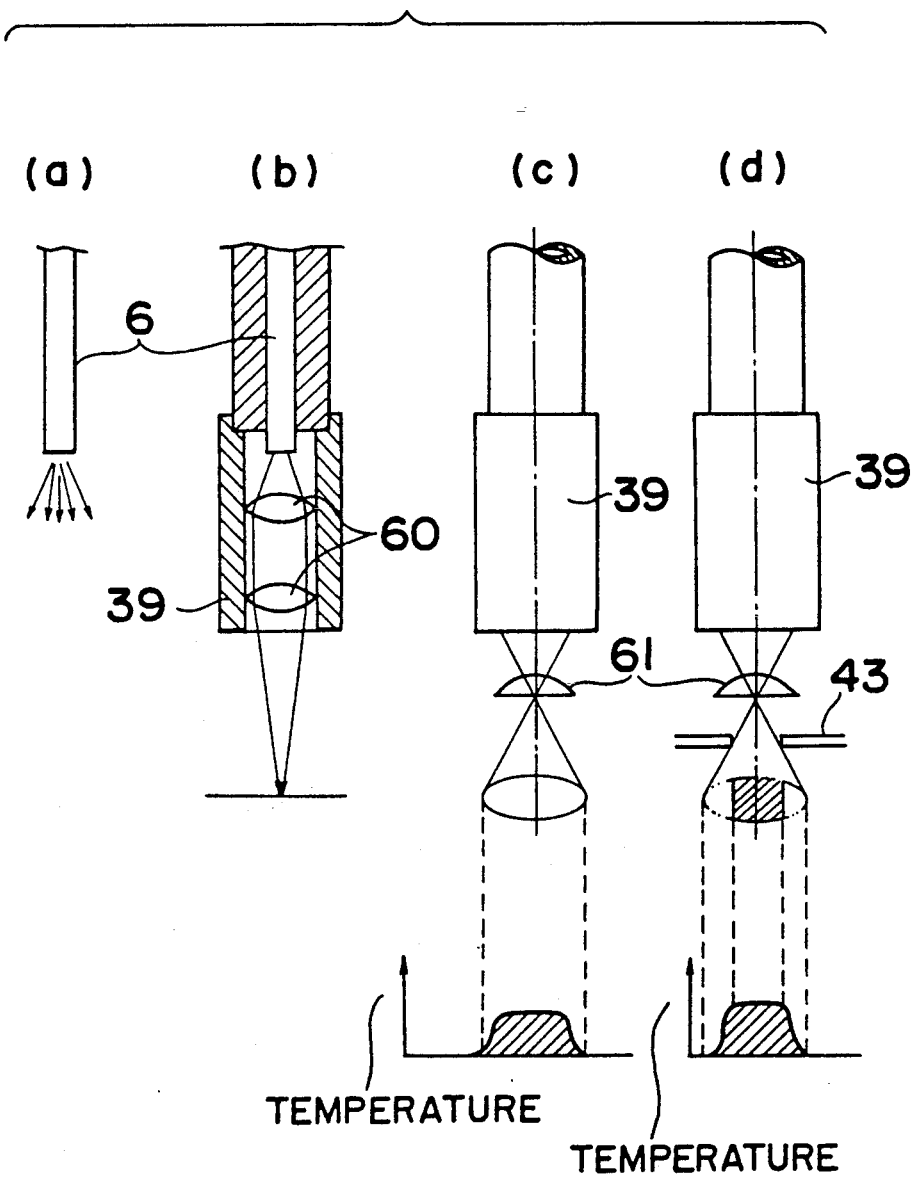
FIGS. 6a–d are views showing principles of laser beam irradiation.
Figure 19:
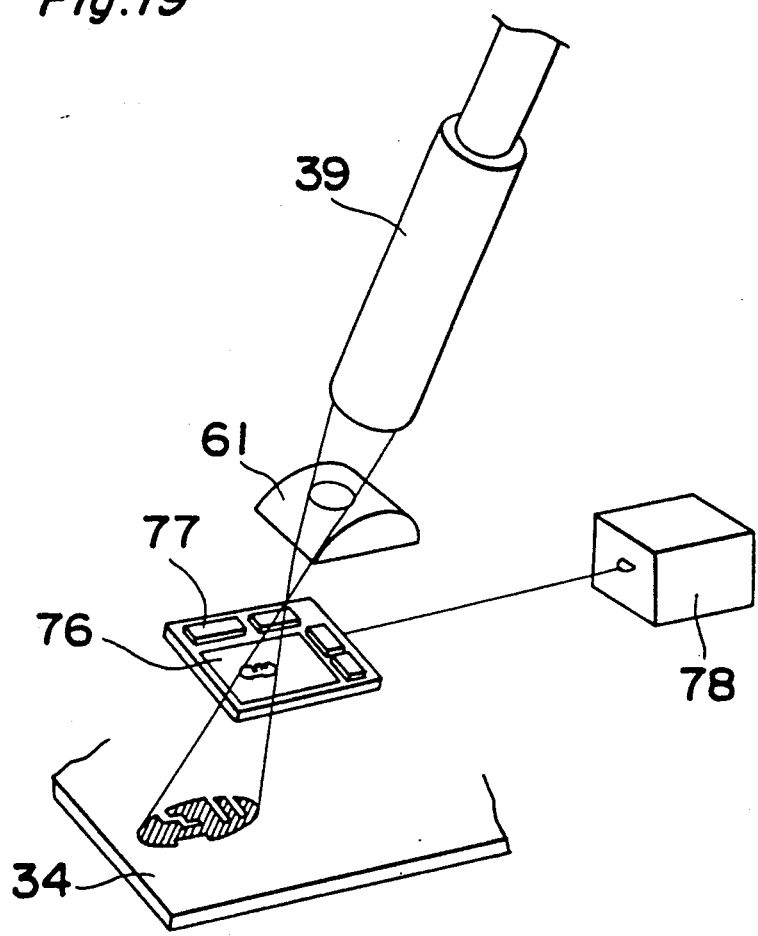
FIG. 19 is a view showing an embodiment in which laser beams are irradiated to the substrate through a liquid crystal shutter.

Referring to FIG. 19, laser beams emitted from the beam-emitting portion 39 are polarized in an elliptical configuration by the cylindrical lens 61 as shown in FIG. 6. A liquid crystal shutter 76 is provided in the optical path of the laser beam. The liquid crystal shutter 76 has a two-dimensional matrix structure in which liquid crystal driving integrated circuits 77 arranged in the X-direction and the Y-direction are driven by a controller 78 to designate a desired diagram at a desired position of the matrix. A pattern obtained by partly intercepting the beams according to the diagram can be projected on the substrate 34 by applying a voltage to the liquid crystal shutter 76. According to the liquid crystal shutter 76, the pattern obtained by partly intercepting the beams can be set for each pixel. Thus, the pattern obtained by partly intercepting the beams provides a fine configuration with a high accuracy, and an electrical connection can be achieved at a high density.

The fourth embodiment of the present invention is described below with reference to FIG. 20. A beam-intercepting plate 43c which can cope with irradiation conditions which vary according to the configuration of the electronic components is disposed below the cylindrical lens 61 in the optical paths of laser beams emitted from the beam-emitting portion 39. A driving means provided at a position different from the position of the connecting head 2 opens and closes the opening of the beam-intercepting plate 43c.

Figure 20:
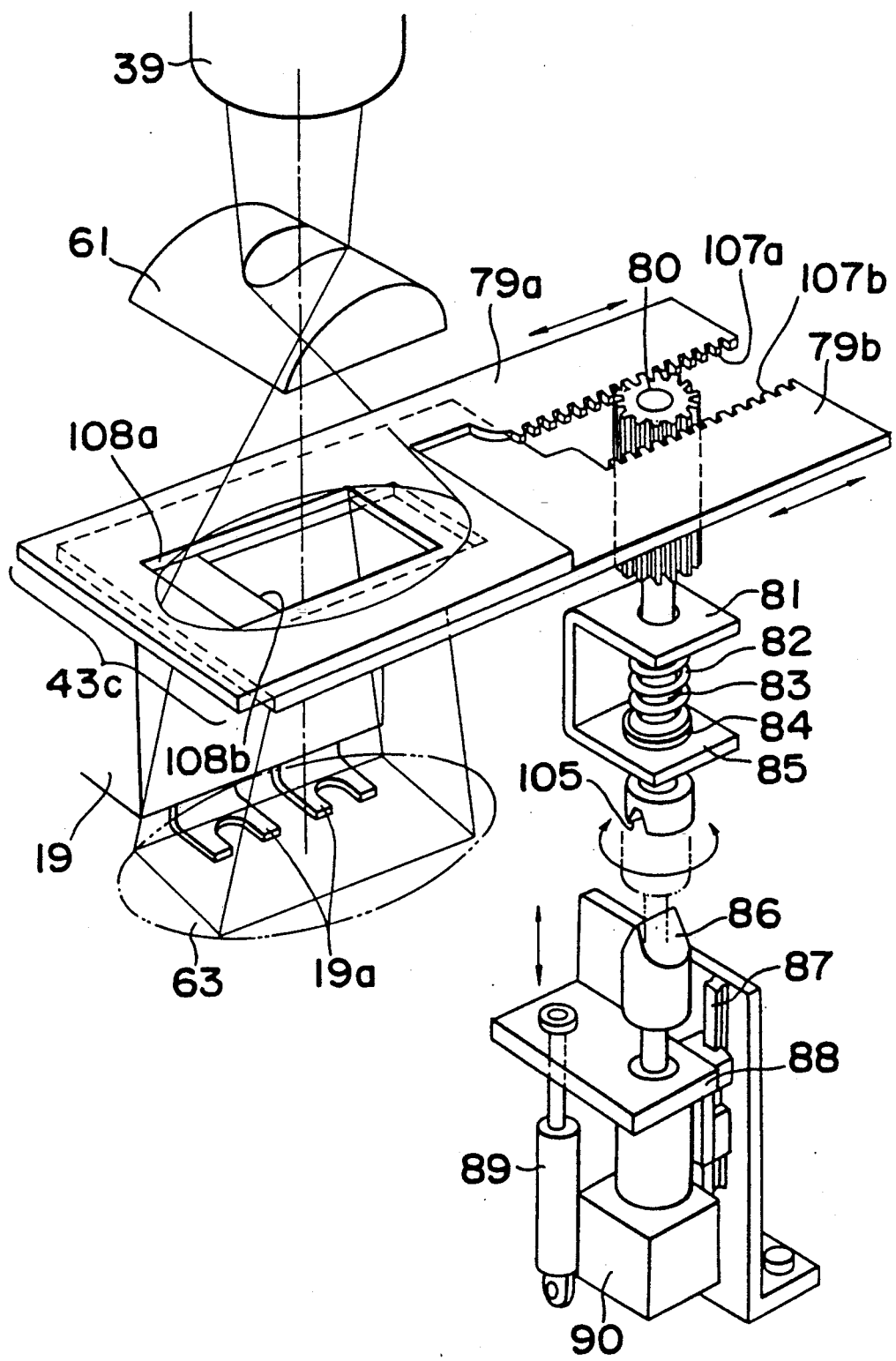
FIG. 20 is a perspective view showing a beam-intercepting plate capable of adjusting the area of an opening and a driving means to be used to drive the beam-intercepting plate.

Referring to FIG. 20, the beam-intercepting plate 43c comprises plates 79a and 79b having openings 108a and 108b formed therein, respectively. Racks 107a and 107b formed in opposition to each other on the plates 79a and 79b engage a pinion 80. The pinion 80 is mounted on a shaft 83 having a flange 84 at approximately the center thereof and a V-shaped groove 105 at the lower end thereof. The shaft 83 penetrates through an opening formed in the center of a bracket 81. A compression spring 82 presses the bottom surface of the flange 84 against a bracket braking surface 85 of the bracket 81. The bracket 81, the beam-intercepting plate 43c, the cylindrical lens 61, and the beam-emitting portion 39 are connected with the connecting head 2 by a bracket (not shown).

The projection of a driver 86 engaged by the shaft of a motor 90 can engage the V-shaped groove 105 of the shaft 83. A cylinder 89 moves the motor 90 vertically under the guidance of a linear motion guide (LM guide) 87 connected with a bracket 88. When the cylinder 89 causes the driver 86 to engage the V-shaped groove 105 of the shaft 83, a preferable gap is formed between the lower surface of the flange 84 and the upper surface of the bracket braking surface 85 due to the upward movement of the motor 90. Thus, friction is not generated therebetween.

In adjusting the area of the opening of the beam-intercepting plate 43c, the connecting head 2 is moved to a predetermined position where the V-shaped groove 105 disposed at the lower end of the shaft 83 can engage the driver 86 at a predetermined position. Then, the cylinder 89 moves the bracket 88, the motor 90, and the driver 86 upward, and the driver 86 engages the V-shaped groove 105 of the shaft 83, such that the gap is formed between the lower surface of the flange 84 and the upper surface of the bracket braking surface 85. As a result, the pinion 80 is coupled with the motor 90 and is capable of rotating with the motor 90 because the brake is released. Since the plates 79a and 79b have the racks 107a and 107b engaging the pinion 80 formed thereon in opposition to each other, the overlap degree of the openings 108a and 108b of the plates 79a and 79b is adjusted due to the rotation of the motor 90 and, consequently, the beam-intercepting region of the beam-intercepting plate 43c is adjusted. Thereafter, the rotation of the motor 90 terminates and, simultaneously, the cylinder 89 is moved downward. As a result, the lower surface of the flange 84 of the shaft 83 remains pressed against the bracket braking surface 85 by the operation of the compression spring 82. The driver 86 disengages from the V-shaped groove 105 of the shaft 83 and the connecting head 2 becomes capable of moving.

A series for processes of adjusting the beam-intercepting region described above allows for adaptation to various irradiation requirements of electronic components.

The beam-intercepting means shown in the second through the fourth embodiments are effective for use with light sources includes a xenon lamp, an ultraviolet ray lamp, or an infrared lamp other than laser beams.

Figure 21:
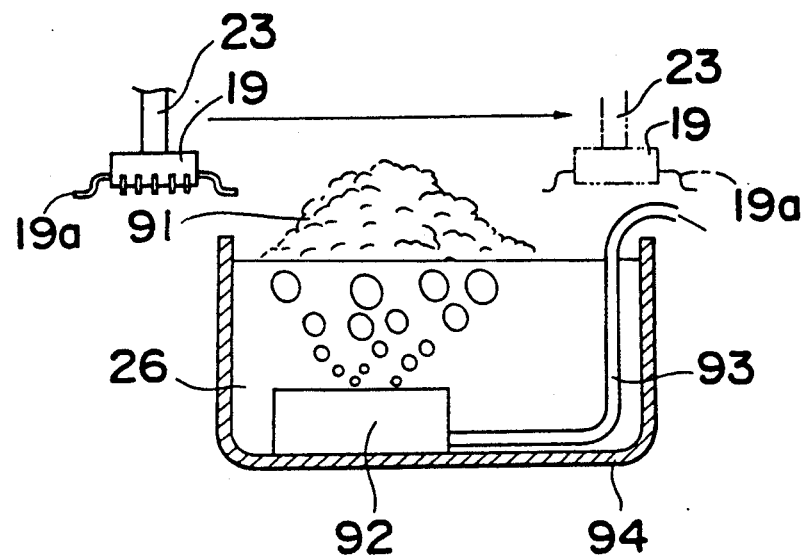
FIG. 21 is a view showing a process of applying bubble flux to the electronic component.

A fifth embodiment is described below. In the fifth embodiment, the construction and operation of a flux-applying means for applying flux at a high speed other than that of the first embodiment is described with reference to FIG. 21.

A bubble-forming block 92 is placed in a flux tank 94 containing flux 26. Air is introduced into the bubble-forming block 92 through a hose 93. As a result, the flux 26 contained in the flux tank 94 vesicates and flux bubbles 91 are formed on the surface of liquid. The electronic component 19 supplied to a predetermined position and gripped by the nozzle 23 is moved in to the flux bubbles 91. As a result, the flux 26 can be applied to the electrodes 19a of the electronic component 19. This method eliminates the need for stopping the connecting head 2 at a predetermined position above the flux-applying section 5 in opposition thereto and allows the flux 26 to be applied at a high speed.

However, since, in addition to the electrodes of the electronic component 19, the flux 26 is applied to the peripheral portion thereof, it is necessary to wash the electronic component 19 before it is connected with the substrate 34. Thus, this flux-applying means cannot be applied to an unwashable electronic component, but applies flux to a washable low-heat-resistant electronic component at a high speed in connecting it with a substrate.

The flux-applying means described above apply the flux 26 to the electrode of the electronic component 19. A method for applying flux to the electrodes of the substrate 34 according to a sixth embodiment is described below.

Figure 22:
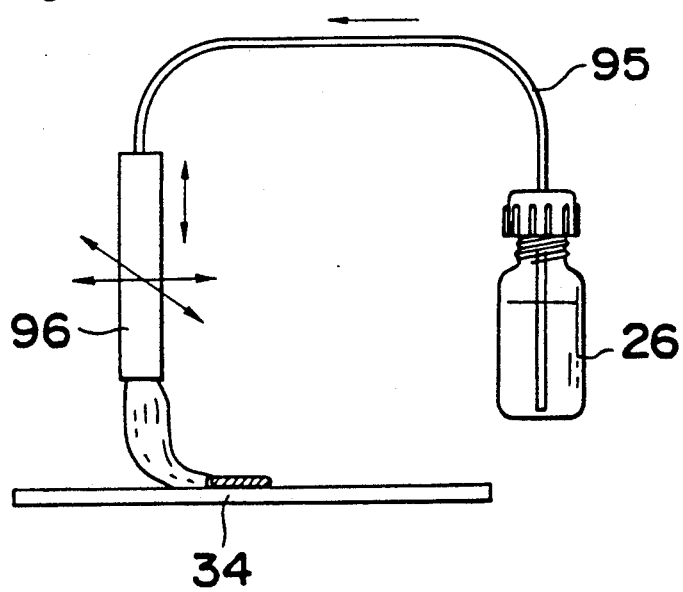
FIG. 22 is a view showing the process of applying flux to the substrate by means of a writing brush impregnated with flux.
Figure 23:
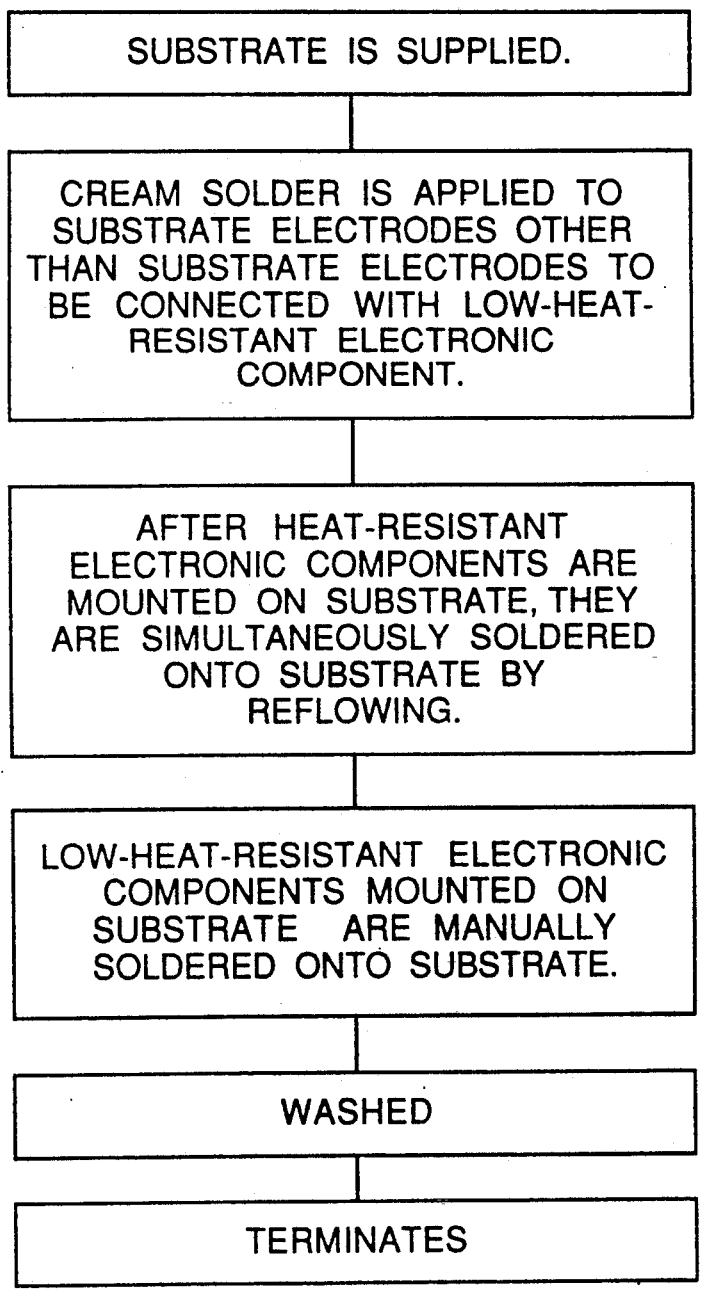
FIG. 23 is a flow diagram showing a conventional process of manually connecting a low-heat-resistant electronic component to a substrate.
Figure 24:
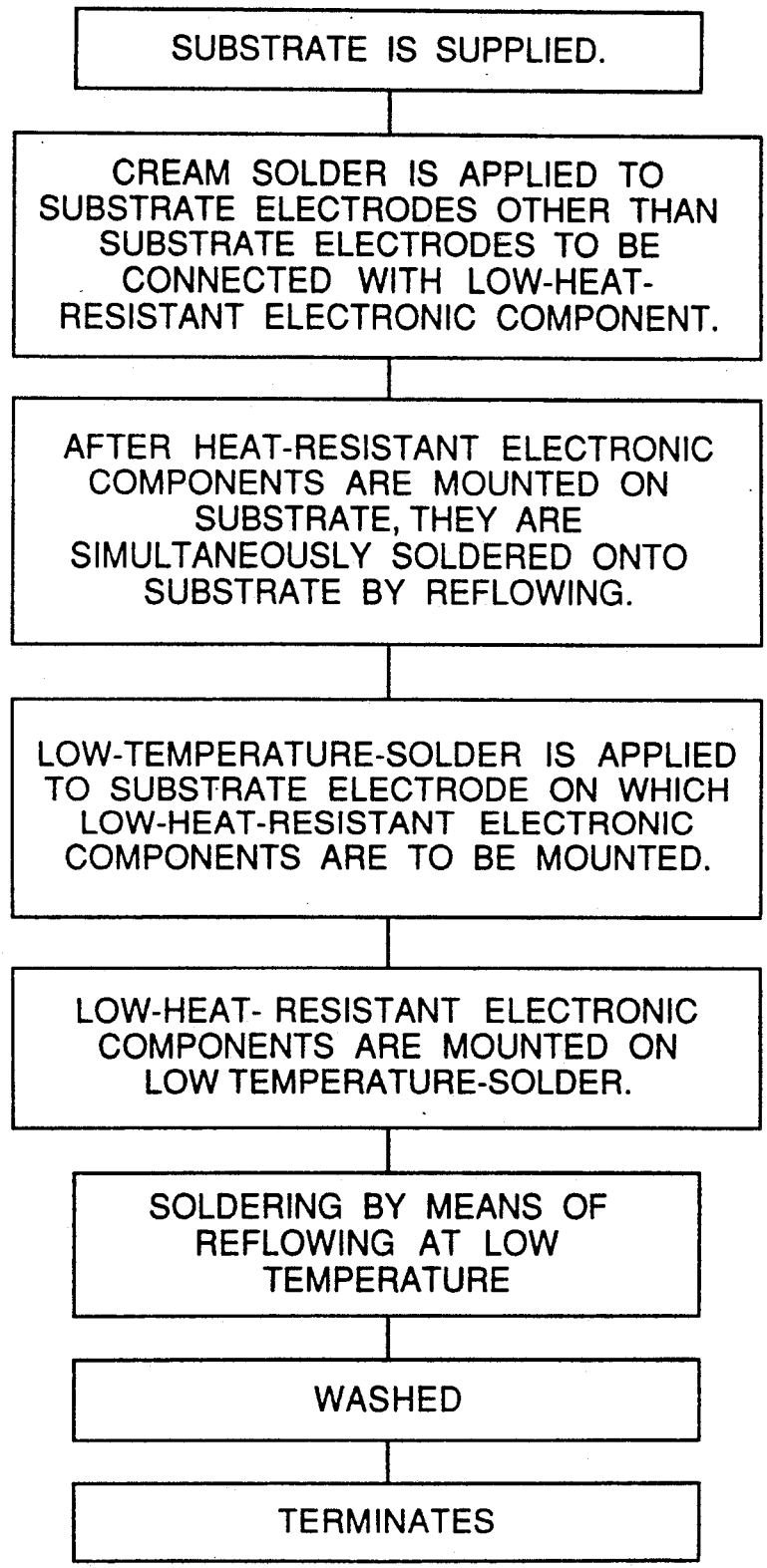
FIG. 24 is a flow diagram showing a conventional process of soldering a low-heat-resistant electronic component onto the substrate by reflowing at a low temperature.
Figure 25:
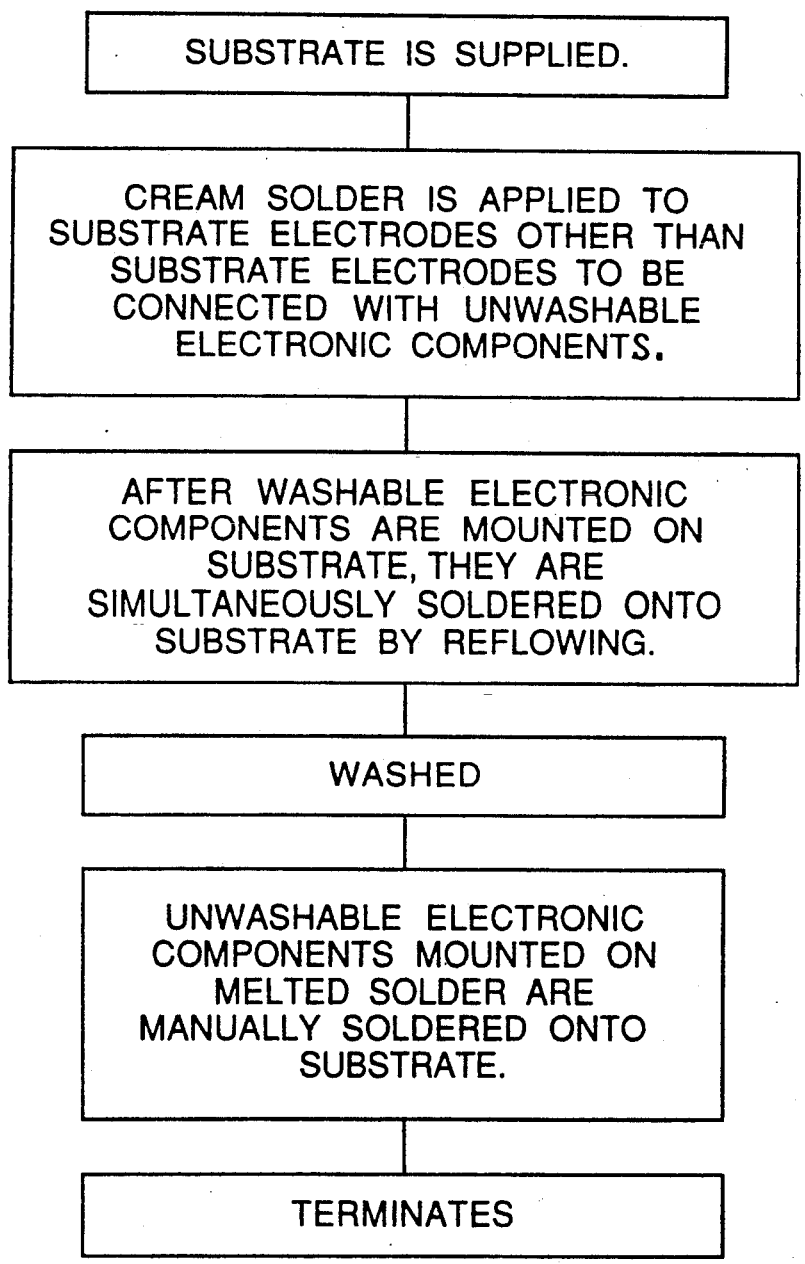
FIG. 25 is a flow diagram showing a conventional process of manually soldering an unwashable heat-resistant electronic component onto the substrate.
Figure 26:
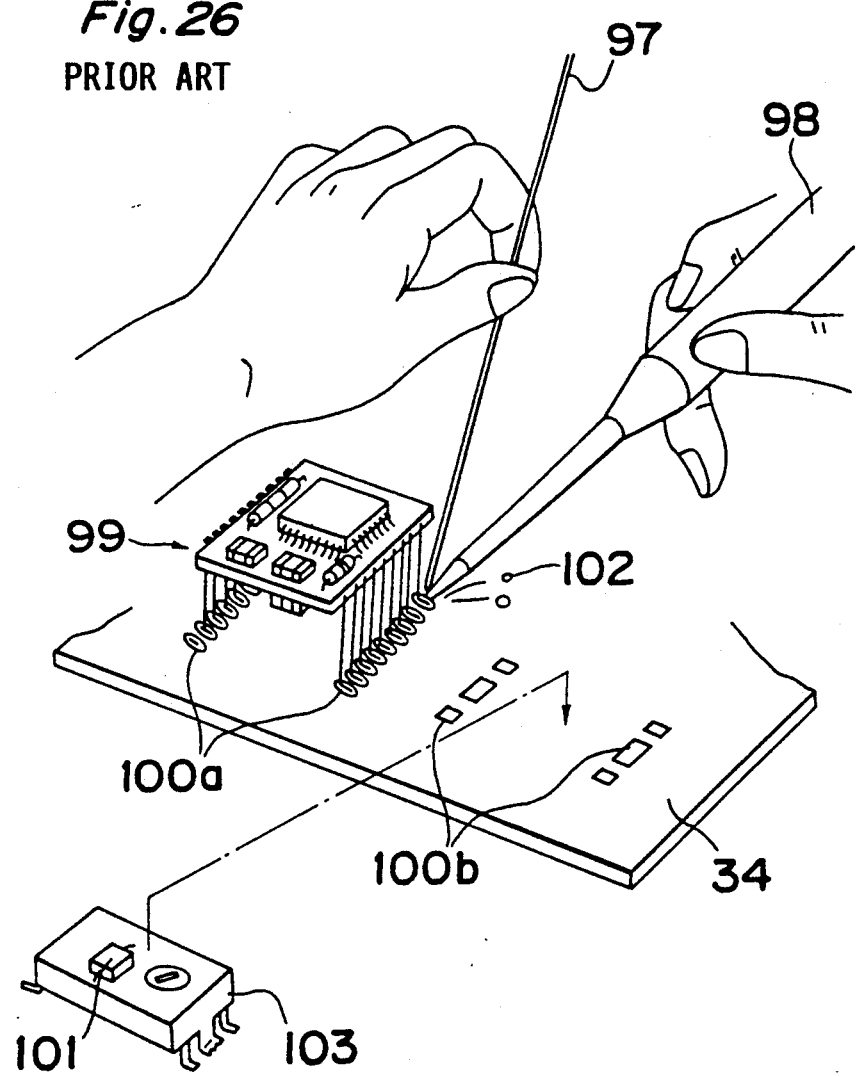
FIG. 26 is a perspective view showing the conventional process of manually connecting the unwashable heat-resistant electronic component onto the substrate.

Referring to FIG. 22, the flux 26 contained in a container is supplied to a writing brush 96 through a hose 95. Since the leading end portion of the writing brush 96 is composed of a plurality of capillaries, an appropriate amount of the flux 26 is incessantly supplied thereto due to capillary phenomenon. A driving means grips the writing brush 96 so that it is movable in three-dimensions. Therefore, the flux 26 can be applied to desired portions of the substrate 34. This method allows the flux 26 to be reliably applied to the pre-soldered portion in a smaller amount compared with a dispenser.

According to the method of the embodiment, in electrically connecting both a low-heat-resistant component and a heat-resistant component or both a washable component and an unwashable component to a substrate, the low-heat-resistant component and the unwashable component can be automatically connected with the substrate without creating a bad effect. In addition, the residue of flux and solder balls formed in reflowing are removed from the substrate. Therefore, the function of an electronic circuit is not destroyed and the electronic component can be effectively soldered onto the substrate.

According to the above-described method, after cream solder is applied to the predetermined portion of the substrate so that the electronic component is connected therewith, the heat-resistant electronic component or the washable component is simultaneously soldered onto the substrate at the predetermined portion thereof by means of reflowing. The low-heat-resistant electronic component or the unwashable electronic component is not mounted on the substrate. The cream solder becomes solidified by the simultaneous reflowing and the thickness of the solder of the pre-soldered portion formed on the substrate is set to a preferable thickness for connecting the low-heat-resistant electronic component or the unwashable electronic component. Subsequent to the above process, flux is applied to the low-heat-resistant electronic component or the pre-soldered portion or both. Then, the solder is melted by heating the substrate locally and the low-heat-resistant electronic component is then soldered onto the substrate. Thereafter, all electronic components and the substrate are washed all together. At this time, when the unwashable electric component has been soldered onto the substrate, the substrate is washed to remove the residue of the flux which has stuck to the substrate and solder balls formed thereon during the reflowing after the pre-soldered portion is formed. The flux is applied to the electrode of the unwashable electronic component or the pre-soldered portion and then the solder is heated to melt it. Then, The unwashable electronic component is connected with the substrate. In the pre-soldered portion formed by the reflowing, the flux of the solder evaporates during the reflowing and the solder becomes solidified. Therefore, even though the solder is melted, solder balls are not formed. Thus, the electronic component can be soldered onto the substrate with reliability and high quality.

Since the beam-emitting means is used as the light source for melting the solder of the pre-soldered portion, beams emitted by the beam-emitting means are condensed by the cylindrical lens to increase heat energy. Thus, only the pre-soldered portion, namely, only the portion required can be selectively heated. The cylindrical lens used as the means for condensing beams polarizes the beams in an elliptic configuration. Accordingly, the pre-soldered portion can be heated in a greater area along the major axis of the ellipse than if the pre-soldered portion use irradiated in a circular configuration. The beam-intercepting means provided in the optical path of the beams intercepts polarized beams having a low heat energy density. In this manner, only beams disposed in the center portion of the major axis of the ellipse and having a comparatively high heat energy density can be selectively used as the heat source and portions other than the electrode can be prevented from being heated. In addition, electronic components of various configurations can be soldered onto the substrate by using the following beam-intercepting means capable of selecting the portion to be irradiated depending on the configuration of the electronic component and that of the electrode of the substrate.

Since the beam-emitting plate is removable from the apparatus, the configuration of the beam-emitting plate can be varied according to the configuration of the electronic component. Thus, the portions and length of the pre-soldered portion to be irradiated can be changed by selecting an appropriate beam-emitting plate so as to solder the electronic component of various configurations to the substrate.

The application of a voltage to the liquid crystal shutter allows a fine desired pattern to be projected on the substrate because the liquid crystal shutter partly intercepts beams. Thus, various electronic components can be soldered onto the substrate.

The beam-intercepting means comprising two beam-intercepting plates each having an opening are moved by a driving means so as to adjust the area of the opening by altering the degree of the overlap of the plates. Thus, an irradiation area can be obtained according to the configuration of the electronic component.

The flux-applying means applies flux pumped up in an appropriate amount from the tank by the pumping means to only the electrode of the electric component held by the component-sucking nozzle. The flux-applying means applies the flux to only the pre-soldered portion formed on the substrate by means of a brush impregnated with the flux. Therefore, the flux is not applied to portions other than the pre-soldered portion, which eliminates the need for washing the substrate after the electronic component is soldered to the pre-soldered portion.

The number of the heat sources for melting the solder of the pre-heating portion is set to be equal to the number of the electrodes of the electronic component in soldering a plurality of electrodes of the electronic component onto the substrate at the predetermined position thereof before heating the solder. After all the solder of the pre-soldered portion is melted, the electronic component is mounted on the pre-soldered portion. In this manner, all the electrodes ar simultaneously mounted on the melted solder. Thus, the electronic component does not become inclined. After the electronic component is mounted on the solder, the substrate and the electronic component are heated to form solder fillet on the predetermined portion of the substrate. Then, the solder is cooled to solidify it.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for electrically connecting to a substrate a first electronic component which is resistant to a reflowing temperature and a second electronic component which is not resistant to a reflowing temperature, comprising:
   applying cream solder to a first predetermined portion of the substrate at a position at which said first electronic component is to be mounted, and to a second predetermined portion of the substrate at a position at which said second electronic component is to be mounted;
   mounting the first electronic component to said first predetermined portion of the substrate;
   reflowing by heating said solder applied to said first predetermined portion of the substrate to thereby solder said first electronic component onto the substrate;
   forming a pre-soldered portion of cream solder at said second predetermined portion of the substrate;
   applying flux to one of said second electronic component and said pre-soldered portion;
   operating a suction nozzle to hold said second electronic component and place it on the substrate at said second predetermined portion; and
   soldering said second electronic component to the substrate by directing an irradiating beam toward a predetermined local portion of the substrate at which an electrode of said second electronic component is located to irradiate and locally melt the cream solder of said pre-soldered portion, to thereby avoid heating said second electronic component to the reflowing temperature.

2. A method as recited in claim 1, wherein irradiation of said cream solder is carried out concurrently with mounting said second electronic component on the substrate.

3. A method as recited in claim 1, wherein
   the step of applying flux to said second electronic component comprises holding said second electronic component with a suction nozzle, and pumping flux from a tank to an electrode of said second electronic component.

4. A method as recited in claim 1, wherein
   the step of applying flux to said second electronic component comprises impregnating a brush with flux, and operating said brush to apply the flux impregnated therein to only said pre-soldered portion on the substrate.

5. A method as recited in claim 1, wherein
   soldering said second electronic component to the substrate comprises directing a plurality of irradiating beams toward a plurality of predetermined local portions of the substrate at which electrodes of said second electronic component are located, respectively, to irradiate and locally melt the cream solder of said pre-soldered portion.

6. A method as recited in claim 5, wherein
   in soldering said second electronic component to the substrate:
   said second electronic component is mounted on said pre-soldered portion after all solder of said pre-soldered portion is melted;
   the substrate and said second electronic component are heated to form a solder fillet on said first predetermined portion of the substrate; and
   the substrate and said second electronic component are cooled.

7. A method for electrically connecting to a substrate a first electronic component which is resistant to a reflowing temperature and a second electronic component which is not resistant to a reflowing temperature, comprising:
   applying cream solder to a first predetermined portion of the substrate at a position at which said first electronic component is to be mounted, and to a second predetermined portion of the substrate at a position at which said second electronic component is to be mounted;
   mounting the first electronic component to said first predetermined portion of the substrate;
   reflowing by heating said solder applied to said first predetermined portion of the substrate to thereby solder said first electronic component onto the substrate;
   forming a pre-soldered portion of cream solder at said second predetermined portion of the substrate;

applying flux to one of said second electronic component and said pre-soldered portion;

mounting said second electronic component on said second predetermined potion of the substrate; and soldering said second electronic component to the substrate by directing an irradiating beam toward a predetermined local portion of the substrate at which an electrode of said second electronic component is located to irradiate and locally melt the cream solder of said pre-soldered portion, polarizing said irradiating beam into an elliptical configuration by disposing a cylindrical lens in an optical path of said irradiating beam, and intercepting low heat energy density portions of said irradiating beam while allowing high heat energy density portions of said irradiating beam at a center portion of a major axis of said elliptical configuration to irradiate said cream solder by disposing a beam interceptor in the optical path of the irradiating beam.

8. A method as recited in claim 7, wherein disposing the beam interceptor comprises choosing a beam intercepting plate from among a plurality of beam intercepting plates and removably mounting the chosen beam intercepting plate to an electronic component-connecting apparatus.

9. A method as recited in claim 7, wherein disposing the beam interceptor comprises disposing a liquid crystal shutter in the optical path of said irradiating beam.

10. A method as recited in claim 7, wherein disposing the beam interceptor comprises disposing two beam intercepting plates, each of which includes an opening therethrough, in the optical path of said irradiating beam, such that the openings of the two plates are adjustably overlapped.

11. A method for electrically connecting to a substrate a washable electronic component and an unwashable electronic component, comprising:

applying cream solder to a first predetermined portion of the substrate at a position at which said washable electronic component is to be mounted, and to a second predetermined portion of the substrate at a position at which said unwashable electronic component is to be mounted;

mounting the washable electronic component to said first predetermined portion of the substrate;

reflowing by heating said solder applied to said first predetermined portion of the substrate to thereby solder said washable electronic component onto the substrate;

forming a pre-soldered portion of cream solder at said second predetermined portion of the substrate;

washing the substrate;

applying flux to one of said unwashable electronic component and said pre-soldered portion;

operating a suction nozzle to hold said unwashable electronic component and place it on the substrate at said second predetermined portion; and soldering said second electronic component to the substrate by directing an irradiating beam toward a predetermined local portion of the substrate at which an electrode of said unwashable electronic component is located to irradiate and locally melt the cream solder of said pre-soldered portion, to thereby avoid heating said unwashable electronic component to the reflowing temperature.

12. A method as recited in claim 11, wherein irradiation of said cream solder is carried out concurrently with mounting of said unwashable electronic component on the substrate.

13. A method as recited in claim 11, wherein soldering said unwashable electronic component to the substrate comprises directing a plurality of irradiating beams toward a plurality of predetermined local portions of the substrate at which electrodes of said unwashable electronic component are located, respectively, to irradiate and locally melt the cream solder of said pre-soldered portion.

14. A method as recited in claim 11, wherein in soldering said unwashable electronic component to the substrate:

said unwashable electronic component is mounted on said pre-soldered portion after all solder of said pre-soldered portion is melted;

the substrate sand said unwashable electronic component are heated to form a solder fillet on said first predetermined portion of the substrate; and the substrate and said unwashable electronic component are cooled.

15. A method as recited in claim 11, wherein the step of applying flux to said unwashable electronic component comprises holding said unwashable electronic component with said suction nozzle, and pumping flux from a tank to an electrode of said unwashable electronic component.

16. A method as recited in claim 11, wherein the step of applying flux to said unwashable electronic component comprises impregnating a brush with flux, and operating said brush to apply the flux impregnated therein to only said pre-soldered portion on the substrate.

17. A method for electrically connecting to a substrate a washable electronic component and an unwashable electronic component, comprising:

applying cream solder to a first predetermined portion of the substrate at a position at which said washable electronic component is to be mounted, and to a second predetermined portion of the substrate at a position at which said unwashable electronic component is to be mounted;

mounting the washable electronic component to said first predetermined portion of the substrate;

reflowing by heating said solder applied to said first predetermined portion of the substrate to thereby solder said washable electronic component onto the substrate;

forming a pre-soldered portion of cream solder at said second predetermined portion of the substrate;

washing the substrate;

applying flux to one of said unwashable electronic component and said pre-soldered portion;

mounting said unwashable electronic component on said second predetermined portion of the substrate; and soldering said unwashable electronic component to the substrate by directing an irradiating beam toward a predetermined local portion of the substrate at which an electrode of said unwashable electronic component is located to irradiate and locally melt the cream solder of said pre-soldered portion, polarizing said irradiating beam into an elliptical configuration by disposing a cylindrical lens in an optical path of said irradiating beam, and intercepting low heat energy density portions of said irradiating beam while allowing high heat energy density portions of said irradiating beam at a center portion of a major axis of said elliptical configuration to irradiate said cream solder by disposing a beam interceptor in the optical path of the irradiating beam.

18. A method as recited in claim 17, wherein disposing the beam interceptor comprises choosing a beam intercepting plate from among a plurality of beam intercepting plates and removably mounting the chosen beam intercepting plate to an electronic component-connecting apparatus.

19. A method as recited in claim 17, wherein disposing the beam interceptor comprises disposing a liquid crystal shutter in the optical path of said irradiating beam.

20. A method as recited in claim 17, wherein disposing the beam interceptor comprises disposing two beam intercepting plates, each of which includes an opening therethrough, in the optical path of said irradiating beam, such that the openings of the two plates are adjustably overlapped.

* * * * *